(12) United States Patent
Han et al.

(10) Patent No.: US 12,293,046 B2
(45) Date of Patent: May 6, 2025

(54) ELECTROLUMINESCENT DISPLAY INCLUDING TOUCH SENSOR

(71) Applicant: LG Display Co., Ltd., Seoul (KR)

(72) Inventors: Jonghyun Han, Paju-si (KR); Seungrok Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/418,027

(22) Filed: Jan. 19, 2024

(65) Prior Publication Data

US 2024/0160322 A1  May 16, 2024

Related U.S. Application Data

(60) Continuation of application No. 18/165,008, filed on Feb. 6, 2023, now Pat. No. 11,914,822, which is a
(Continued)

(30) Foreign Application Priority Data

Dec. 29, 2017 (KR) .................. 10-2017-0183798
Dec. 29, 2017 (KR) .................. 10-2017-0184515

(51) Int. Cl.
G09G 5/00 (2006.01)
G06F 3/041 (2006.01)
(Continued)

(52) U.S. Cl.
CPC ............ G06F 3/044 (2013.01); G06F 3/0412 (2013.01); G06F 3/0416 (2013.01);
(Continued)

(58) Field of Classification Search
CPC ...... G06F 3/044; G06F 3/0412; G06F 3/0416; G06F 3/0418; G06F 2203/04102;
(Continued)

(56) References Cited

U.S. PATENT DOCUMENTS 8,237,068 B2   8/2012  Szaikowski
8,502,794 B2   8/2013  Chang
(Continued)

FOREIGN PATENT DOCUMENTS

CN   102498463 A   6/2012
CN   102541371 A   7/2012
(Continued)

OTHER PUBLICATIONS

China National Intellectual Property Administration, Office Action, CN Patent Application No. 201811496294.6, Nov. 11, 2021, 27 pages.
(Continued)

Primary Examiner — Jennifer T Nguyen
(74) Attorney, Agent, or Firm — Fenwick & West LLP

(57) ABSTRACT

An electroluminescent display is disclosed. The electroluminescent display includes an electroluminescent element disposed in a display area of a substrate, an encapsulation unit disposed on the electroluminescent element, a first mesh electrode layer disposed on the encapsulation unit, an insulating layer covering the first mesh electrode layer, and a second mesh electrode layer disposed on the insulating layer. The first mesh electrode layer includes a first mesh electrode and a second mesh electrode separated from the first mesh electrode. The second mesh electrode layer includes a third mesh electrode extended in a first direction and a fourth mesh electrode extended in a second direction intersecting the first direction through the first mesh electrode intersecting the third mesh electrode.

18 Claims, 19 Drawing Sheets

Related U.S. Application Data continuation of application No. 17/209,986, filed on Mar. 23, 2021, now Pat. No. 11,604,545, which is a division of application No. 16/215,347, filed on Dec. 10, 2018, now Pat. No. 10,983,639.

(51) Int. Cl.
*G06F 3/044* (2006.01)
*H10K 50/844* (2023.01)
*H10K 59/122* (2023.01)
*H10K 59/40* (2023.01)

(52) U.S. Cl.
CPC ......... *G06F 3/0418* (2013.01); *H10K 50/844* (2023.02); *H10K 59/122* (2023.02); *H10K 59/40* (2023.02); *G06F 2203/04102* (2013.01); *G06F 2203/04107* (2013.01); *G06F 2203/04111* (2013.01); *G06F 2203/04112* (2013.01)

(58) Field of Classification Search
CPC . G06F 2203/04107; G06F 2203/04111; G06F 2203/04112; H10K 59/40; H10K 59/122; H10K 50/844
USPC .......................................................... 345/174
See application file for complete search history.

(56) References Cited

U.S. PATENT DOCUMENTS

| | | |
|---|---|---|
| 8,531,426 B2 | 9/2013 | Chang |
| 8,614,684 B2 | 12/2013 | Chang |
| 8,614,685 B2 | 12/2013 | Chang |
| 8,614,686 B2 | 12/2013 | Chang |
| 8,614,687 B2 | 12/2013 | Chang |
| 8,614,688 B2 | 12/2013 | Chang |
| 8,730,193 B2 | 5/2014 | Chang et al. |
| 8,754,868 B2 | 6/2014 | Chang |
| 9,069,411 B2 | 6/2015 | Chang |
| 9,081,440 B2 | 7/2015 | Chang |
| 9,542,050 B2 | 1/2017 | Monney |
| 9,671,914 B2 | 6/2017 | Kim et al. |
| 9,891,735 B2 | 2/2018 | Bae et al. |
| 10,209,549 B2 | 2/2019 | Lin et al. |
| 10,739,917 B2 | 8/2020 | Kurasawa et al. |
| 11,226,680 B2 | 1/2022 | Kurasawa et al. |
| 11,604,545 B2 | 3/2023 | Han et al. |
| 2011/0032193 A1 | 2/2011 | Szalkowski |
| 2012/0033168 A1 | 2/2012 | Hwang et al. |
| 2012/0075230 A1 | 3/2012 | Nagata |
| 2012/0120011 A1 | 5/2012 | Teng et al. |
| 2012/0169649 A1 | 7/2012 | Chang |
| 2012/0169650 A1 | 7/2012 | Chang |
| 2012/0169651 A1 | 7/2012 | Chang |
| 2012/0169652 A1 | 7/2012 | Chang |
| 2012/0169653 A1 | 7/2012 | Chang |
| 2012/0169655 A1 | 7/2012 | Chang |
| 2012/0169656 A1 | 7/2012 | Chang |
| 2012/0299874 A1 | 11/2012 | Chang |
| 2012/0327028 A1 | 12/2012 | Chang et al. |
| 2013/0285971 A1 | 10/2013 | Elias et al. |
| 2013/0314376 A1 | 11/2013 | Chang |
| 2014/0049704 A1 | 2/2014 | Yao et al. |
| 2014/0300575 A1 | 10/2014 | Chang |
| 2014/0340598 A1 | 11/2014 | Johansson et al. |
| 2015/0145808 A1* | 5/2015 | Cho ................... G06F 3/0412 345/174 |
| 2015/0220191 A1 | 8/2015 | Huh et al. |
| 2015/0261360 A1 | 9/2015 | Chang |
| 2016/0004368 A1 | 1/2016 | Kurasawa et al. |
| 2016/0126498 A1* | 5/2016 | Kim ..................... H10K 50/818 257/40 |
| 2016/0154499 A1 | 6/2016 | Bae et al. |
| 2016/0170524 A1 | 6/2016 | Kim et al. |
| 2016/0378224 A1* | 12/2016 | Kwon ............... H10K 59/1315 345/174 |
| 2017/0102804 A1 | 4/2017 | Kikukawa et al. |
| 2017/0185203 A1 | 6/2017 | Seong |
| 2018/0004027 A1 | 1/2018 | Lin et al. |
| 2018/0143708 A1* | 5/2018 | Ko ......................... G06F 3/041 |
| 2019/0131364 A1* | 5/2019 | Hayk ................... H10K 50/805 |
| 2019/0165312 A1* | 5/2019 | Bae .......................... G09G 3/20 |
| 2020/0333899 A1 | 10/2020 | Kurasawa et al. |

FOREIGN PATENT DOCUMENTS

| | | |
|---|---|---|
| CN | 106325639 A | 1/2017 |
| JP | 2016-018011 A | 2/2016 |
| KR | 10-2016-0065396 A | 6/2016 |
| KR | 10-2016-0072336 A | 6/2016 |

OTHER PUBLICATIONS

European Patent Office, Examination Report, European Patent Application No. 18212301.8, May 19, 2023, 13 pages.
Extended European search report, European patent application No. 18212301.8, May 3, 2019, 11 pages.
Korean Intellectual Property Administration, Office Action, KR Patent Application No. 10-2017-0183798, Jan. 18, 2022, 11 pages.
United States Office Action, U.S. Appl. No. 16/215,347, filed Sep. 2, 2020, 12 pages.
United States Office Action, U.S. Appl. No. 17/209,986, filed Sep. 14, 2022, 16 pages.
United States Office Action, U.S. Appl. No. 18/165,008, filed Jul. 19, 2023, 14 pages.

* cited by examiner

ELECTROLUMINESCENT DISPLAY INCLUDING TOUCH SENSOR

CROSS-REFERENCE TO RELATED APPLICATIONS

This application is a continuation of U.S. patent application Ser. No. 18/165,008 filed on Feb. 6, 2023 which is a continuation of U.S. patent application Ser. No. 17/209,986 filed on Mar. 23, 2021 which is a divisional of U.S. patent application Ser. No. 16/215,347 filed on Dec. 10, 2018, which claims the benefit of Republic of Korea Patent Application No. 10-2017-0183798 filed on Dec. 29, 2017 and Republic of Korea Patent Application No. 10-2017-0184515 filed on Dec. 29, 2017, each of which are herein incorporated by reference in its entirety.

BACKGROUND

Field of Technology

The present disclosure relates to an electroluminescent display including a touch sensor, and more particularly to an electroluminescent display for reducing a thickness of the electroluminescent display and minimizing an influence of a parasitic capacitance between a touch sensor and a display panel.

Discussion of the Related Art

A touch screen is an input device that allows a user to input his or her command by selecting an instruction displayed on a screen of a display device, etc. with his/her hand or an object. Namely, the touch screen converts a touch position, which the user directly touches with his/her hand or the object, into an electrical signal and senses an instruction selected at the touch position as an input signal. Because the touch screen can replace a separate input device, for example, a keyboard and a mouse connected to the display device, a use range of the touch screen is gradually expanding. The touch screen is generally attached to a front surface of a display panel.

SUMMARY

The present inventors have continued to study to provide a touch sensor capable of performing a touch screen function for an electroluminescent display capable of implementing a high quality image among various kinds of display devices is disclosed. The electroluminescent display includes a self-emission element. Examples of an electroluminescent element include an organic light emitting diode (OLED) and a quantum-dot light emitting diode (QLED).

The present inventors studied an electroluminescent display capable of providing both a touch screen function and a flexibility function.

The present inventors paid attention to advantages that the electroluminescent display can have a flexible function when the flexibility function was provided for an encapsulation unit of the electroluminescent display, and also the encapsulation unit of the electroluminescent display was not be damaged by various external forces including falling, impact, bending, etc. In particular, the present inventors recognized the problem that an operation of the electroluminescent display may be impossible when the encapsulation unit of the electroluminescent display was damaged.

The present inventors designed a flexible encapsulation unit sealing an electroluminescent layer, in order to provide the flexibility function for the electroluminescent display while protecting the electroluminescent element from an external environment. The present inventors studied a structure of a flexible touch sensor disposed on the encapsulation unit.

The present inventors recognized that interference may occur between a cathode electrode and a capacitive touch sensor when the capacitive touch sensor was used in a touch screen of the electroluminescent display because the electroluminescent display included a plurality of subpixels, each of which includes a cathode electrode, an anode electrode, and an electroluminescent layer between the cathode electrode and the anode electrode in order to emit light. In particular, the present inventors recognized that a parasitic capacitance may greatly reduce an operation performance of the capacitive touch sensor.

The present inventors recognized that a parasitic capacitance was generated between the touch sensor and the cathode electrode when the cathode electrode of the subpixel was disposed adjacent to the touch sensor. The present inventors recognized the problem that a touch operation of the touch sensor may be impossible because the parasitic capacitance increased as a distance between the touch sensor and the cathode electrode decreased.

However, the present inventors recognized advantages of a thin profile of the electroluminescent display, an improvement of flexibility characteristics, and a reduction in a possibility of cracking of the encapsulation unit as a thickness of the encapsulation unit decreased. Therefore, the present inventors intended to reduce the thickness of the encapsulation unit as much as possible. The present inventors recognized that a reduction in a touch performance of the touch sensor had to be solved because the parasitic capacitance increased as the thickness of the encapsulation unit decreased. Further, the present inventors recognized that the touch sensor may be bent and damaged by such a bending stress when the flexibility characteristics of the touch sensor were insufficient. Hence, the present inventors also intended to improve the flexibility characteristics of the touch sensor.

Namely, the present inventors intended to provide an electroluminescent display that can reduce a damage resulting from an impact, reduce the thickness, provide the flexibility characteristics, and provide a touch screen function while minimizing an influence of the parasitic capacitance resulting from the cathode electrode. At the same time, the present inventors intended to optimize the manufacturing cost and manufacturing process of the electroluminescent display.

Further, the present inventors intended to minimize the thickness of the flexible encapsulation unit in order to develop the electroluminescent display to a foldable level by maximizing the flexibility characteristics.

Accordingly, an object of the present disclosure is to address the above-described and other problems and provide a flexible electroluminescent display, configured to provide a touch screen function, capable of reducing a distance between a touch sensor and a cathode electrode of the electroluminescent display, improving flexibility characteristics of the touch sensor, minimizing an influence of a parasitic capacitance resulting from the cathode electrode, simplifying manufacturing process, and reducing the manufacturing cost.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

In one aspect, there is provided an electroluminescent display comprising: an electroluminescent element disposed in a display area of a substrate, the display area for displaying an image; an encapsulation unit disposed on the electroluminescent element; a first mesh electrode layer disposed on the encapsulation unit, the first mesh electrode including a first mesh electrode and a second mesh electrode that is physically separated from the first mesh electrode; an insulating layer covering the first mesh electrode layer; and a second mesh electrode layer disposed on the insulating layer, the second mesh electrode layer including a third mesh electrode and a fourth mesh electrode, wherein the third mesh electrode extends in a first direction and the fourth mesh electrode extends in a second direction that intersects the first direction such that the first mesh electrode of the first mesh electrode layer intersects the third mesh electrode.

In another aspect, there is provided a flexible electroluminescent display comprising: a flexible substrate; a transistor positioned on the flexible substrate; an anode electrode electrically connected with the transistor; a bank surrounding the anode electrode; an electroluminescent layer positioned on the anode electrode; a cathode electrode positioned on the electroluminescent layer; a flexible encapsulation unit positioned on the cathode electrode; a first mesh electrode layer positioned on the flexible encapsulation unit and overlapping the bank; an insulating layer covering the first mesh electrode layer; and a second mesh electrode layer positioned on the insulating layer and overlapping the first mesh electrode layer and the bank.

In another aspect, there is provided a touch sensor integrated display comprising: a substrate; a plurality of subpixels disposed on the substrate, the plurality of subpixels including a plurality of circuit units and an electroluminescent diode electrically connected to the plurality of circuit units, at least one of the plurality of circuit units configured to supply an image signal to the electroluminescent diode; an encapsulation unit configured to cover the plurality of subpixels; a first mesh electrode layer disposed on the encapsulation unit, the first mesh electrode layer divided into a plurality of areas that are physically separated from each other by a first disconnection pattern; an insulating layer covering the first mesh electrode layer; and a second mesh electrode layer disposed on the insulating layer, the first mesh electrode layer divided into a plurality of areas that are physically separated from each other by a second disconnection pattern, wherein a shape of the first disconnection pattern is different from a shape of the second disconnection pattern, and wherein at least one of the plurality of areas of the first mesh electrode layer and one of the plurality of areas of the second mesh electrode layer are configured to respectively receive a first signal and a second signal having a same magnitude.

In another aspect, there is provided an electroluminescent display comprising: an electroluminescent element disposed in a display area of a substrate, the display area for displaying an image; an encapsulation unit disposed on the electroluminescent element; a plurality of transparent shielding electrodes disposed on the encapsulation unit, each of the plurality of transparent shielding electrodes including a first transparent shielding electrode along a first direction and a plurality of second transparent shielding electrodes along a second direction, wherein the first transparent shielding electrode intersects the plurality of second transparent shielding electrodes; a shielding electrode insulating layer covering the plurality of transparent shielding electrodes; a plurality of bridge mesh electrodes positioned on the shielding electrode insulating layer, the plurality of bridge mesh electrodes includes a plurality of first bridges and a plurality of second bridges; a first touch insulating layer covering the plurality of bridge mesh electrodes; and a plurality of mesh electrodes on the first touch insulating layer, the plurality of mesh electrodes including a plurality of first mesh electrodes along the first direction and a plurality of second mesh electrodes along the second direction; wherein a pair of second bridges from the plurality of second bridges are configured to electrically connect together the plurality of second transparent shielding electrodes of one of the plurality of transparent shielding electrodes through a contact hole of the shielding electrode insulating layer, wherein the plurality of first bridges are configured to electrically connect together plurality of first mesh electrodes through contact holes of the first touch insulating layer.

In another aspect, there is provided an electroluminescent display comprising: a substrate including a display area for displaying an image; an electroluminescent element on the display area of the substrate, the electroluminescent element including a common electrode; an encapsulation unit on the electroluminescent element; a first mesh electrode layer on the encapsulation unit, the first mesh electrode overlapping the common electrode; an insulating layer over the first mesh electrode layer; and a second mesh electrode layer on the insulating layer, the second mesh electrode layer overlapping both the first mesh electrode layer and the common electrode with the first mesh electrode layer between the second mesh electrode layer and the common electrode.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

DETAILED DESCRIPTION

Figure 1:
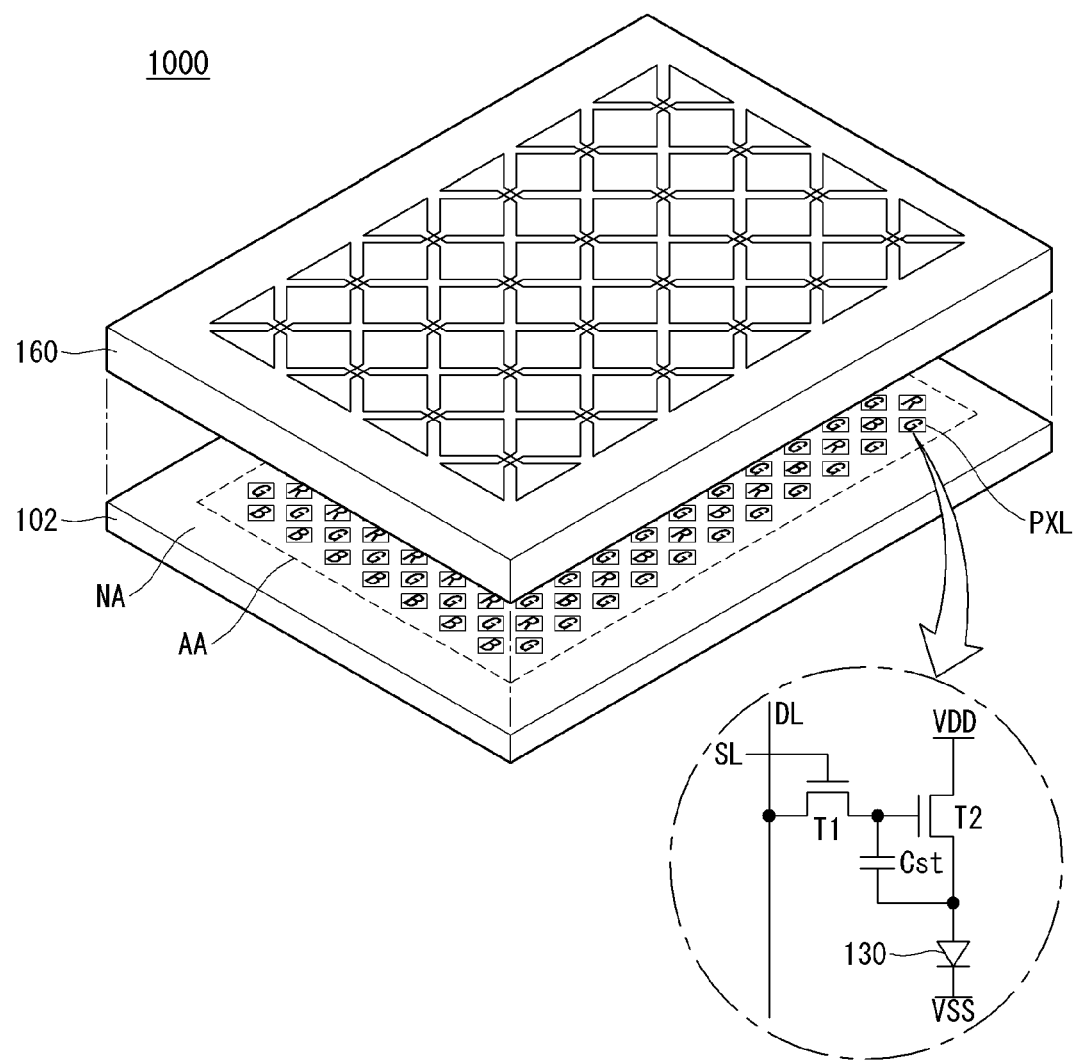
FIG. 1 is an exploded perspective view schematically illustrating an electroluminescent display including a touch sensor according to an embodiment of the disclosure.

Reference will now be made in detail to embodiments of the disclosure, examples of which are illustrated in the accompanying drawings. However, the present disclosure is not limited to embodiments disclosed below, and may be implemented in various forms. These embodiments are provided so that the present disclosure will be described more completely, and will fully convey the scope of the present disclosure to those skilled in the art to which the present disclosure pertains. Particular features of the present disclosure can be defined by the scope of the claims.

Shapes, sizes, ratios, angles, number, and the like illustrated in the drawings for describing embodiments of the disclosure are merely exemplary, and the present disclosure is not limited thereto unless specified as such. Like reference numerals designate like elements throughout embodiments of the disclosure. In the following description, when a detailed description of certain functions or configurations related to this document that may unnecessarily cloud the gist of the present disclosure have been omitted. In the present disclosure, when the terms "include," "have," "comprised of," etc. are used, other components may be added unless "~only" is used. A singular expression can include a plural expression as long as it does not have an apparently different meaning in context.

In the explanation of components, even if there is no separate description, it is interpreted as including margins of error or an error range.

In the description of positional relationships, when a structure is described as being positioned "on or above," "under or below," "next to" another structure, this description should be construed as including a case in which the structures directly contact each other as well as a case in which a third structure is disposed therebetween.

The terms "first," "second," etc. may be used to describe various components, but the components are not limited by such terms. The terms are used only for the purpose of distinguishing one component from other components. For example, a first component may be designated as a second component, and vice versa, without departing from the scope of the present disclosure.

The features of various embodiments of the disclosure can be partially combined or entirely combined with each other, and can be technically interlocking-driven in various ways. Embodiments of the disclosure can be independently implemented, or can be implemented in conjunction with each other.

Embodiments of the disclosure will be described in detail below with reference to FIGS. 1 to 16C.

FIG. 1 is an exploded perspective view schematically illustrating an electroluminescent display including a touch sensor according to an embodiment of the disclosure.

An electroluminescent display 1000 according to an embodiment of the disclosure is described below with reference to FIG. 1.

The electroluminescent display 1000 according to the embodiment of the disclosure is configured to provide a touch screen function for sensing a touch, an image display function for displaying an image, and a function for reducing a parasitic capacitance generated between a touch screen and an image display.

The electroluminescent display 1000 according to the embodiment of the disclosure includes a display panel 102 configured to display an image and a touch sensor 160 configured to sense a touch.

The display panel 102 of the electroluminescent display 1000 according to the embodiment of the disclosure includes a plurality of subpixels PXL. In the display panel 102, an area where the plurality of subpixels PXL is disposed may be defined as a display area AA, and an area except the display area AA or a peripheral area of the display area AA may be defined as a non-display area NA.

Each subpixel PXL includes an electroluminescent element 130 displaying a specific color. For example, the subpixel PXL may include red (R), green (G), and blue (B) electroluminescent elements 130, or include red (R), green (G), blue (B), and white (W) electroluminescent elements 130, or include red (R), green (G), blue (B), and green (G) electroluminescent elements 130.

Each subpixel PXL includes a pixel driving circuit and the electroluminescent element 130 connected to the pixel driving circuit.

The pixel driving circuit at least includes a switching transistor T1, a scan line SL supplying a scan signal to the switching transistor T1, a driving transistor T2, a storage capacitor Cst, and a data line DL supplying an image signal to the storage capacitor Cst.

The switching transistor T1 is turned on when the scan signal is supplied to the scan line SL, and supplies a data signal supplied to the data line DL to the storage capacitor Cst and a gate electrode of the driving transistor T2.

The driving transistor T2 controls a current supplied to the electroluminescent element 130 depending on the data signal supplied to the gate electrode of the driving transistor T2 and a high potential voltage VDD supplied from a high potential power line, thereby adjusting an amount of light emitted from the electroluminescent element 130. Even when the switching transistor T1 is turned off, the driving transistor T2 supplies a predetermined current to the electroluminescent element 130 due to a potential difference charged to the storage capacitor Cst until a data signal of a next frame is supplied, thereby keeping the electroluminescent element 130 emitting light. The electroluminescent element 130 may be implemented as an electroluminescent diode. The electroluminescent diode may include an anode electrode, an electroluminescent layer corresponding to the anode electrode, and a cathode electrode corresponding to the electroluminescent layer. The cathode electrode is configured to receive a low potential voltage VSS from a low potential power line.

In embodiments disclosed herein, transistors are not limited to the drawings and may be variously modified into N-type transistors, P-type transistors, and CMOS transistors.

The touch sensor 160 of the electroluminescent display 1000 according to the embodiment of the disclosure may be configured to correspond to the display area AA. However, embodiments are not limited thereto. For example, an area of the touch sensor 160 may be greater than the display area AA, and the touch sensor 160 may be configured to further sense a touch input of the non-display area NA.

The touch sensor 160 includes a plurality of touch electrodes. The touch sensor 160 may be configured to sense change in a mutual capacitance and/or a self-capacitance resulting from a touch operation of a user through the plurality of touch electrodes, sense whether or not there is the touch operation, and detect a touch position when there is the touch operation.

Figure 2:
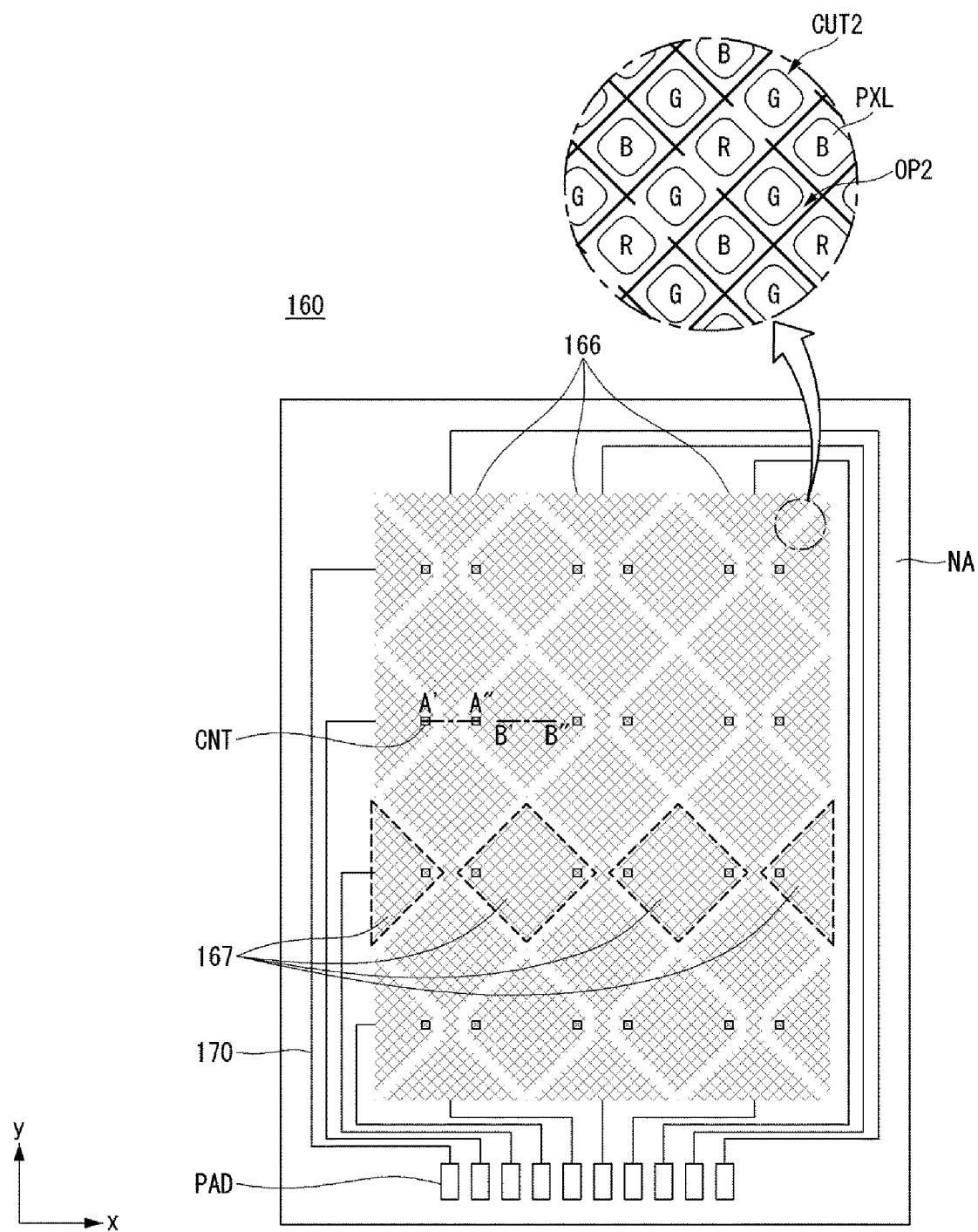
FIG. 2 is a plan view schematically illustrating a first mesh electrode layer of a touch sensor in an electroluminescent display according to an embodiment of the disclosure.

FIG. 2 is a plan view schematically illustrating a first mesh electrode layer of the touch sensor 160 in an electroluminescent display according to an embodiment of the disclosure.

Figure 3:
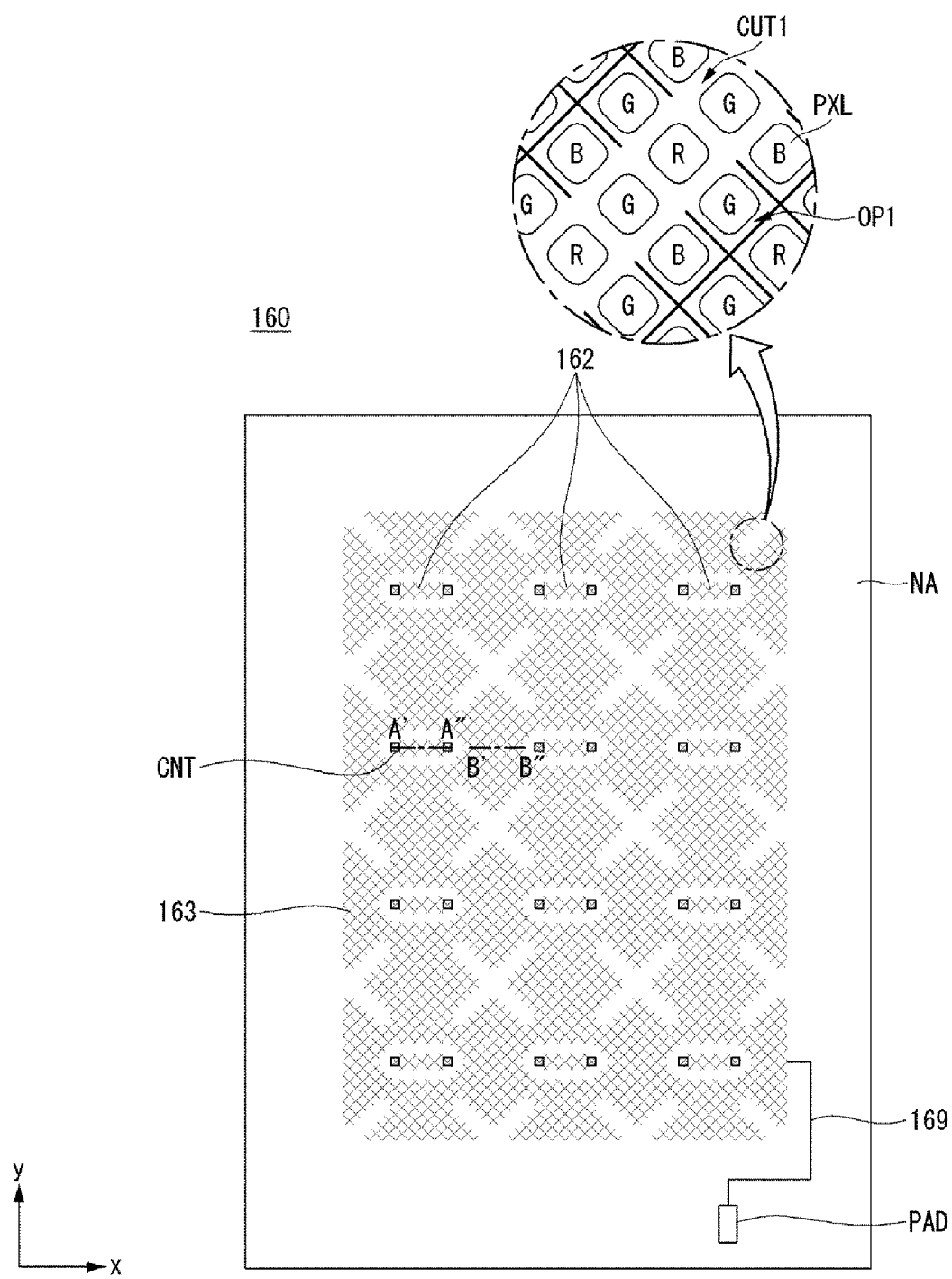
FIG. 3 is a plan view schematically illustrating a second mesh electrode layer of a touch sensor in an electroluminescent display according to an embodiment of the disclosure.

FIG. 3 is a plan view schematically illustrating a second mesh electrode layer of the touch sensor 160 in an electroluminescent display according to an embodiment of the disclosure.

Figure 4:
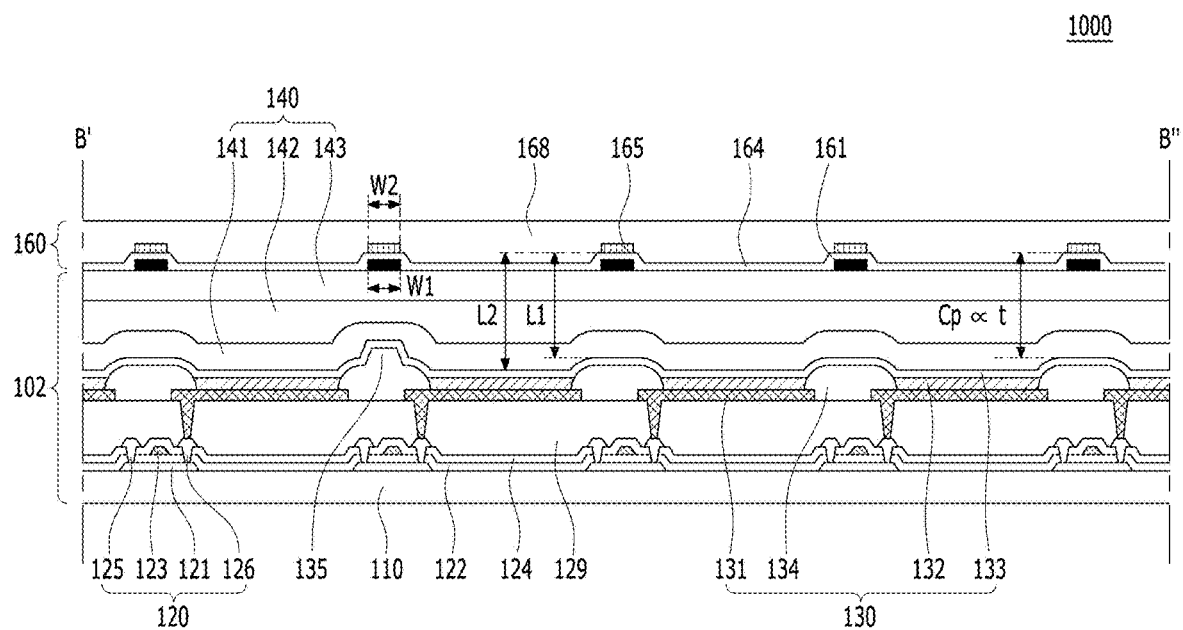
FIG. 4 is a cross-sectional view schematically illustrating a cutting surface A'-A" of a touch sensor according to an embodiment of the disclosure.

FIG. 4 is a cross-sectional view schematically illustrating a cutting surface A'-A" of the touch sensor 160 according to an embodiment of the disclosure.

Figure 5:
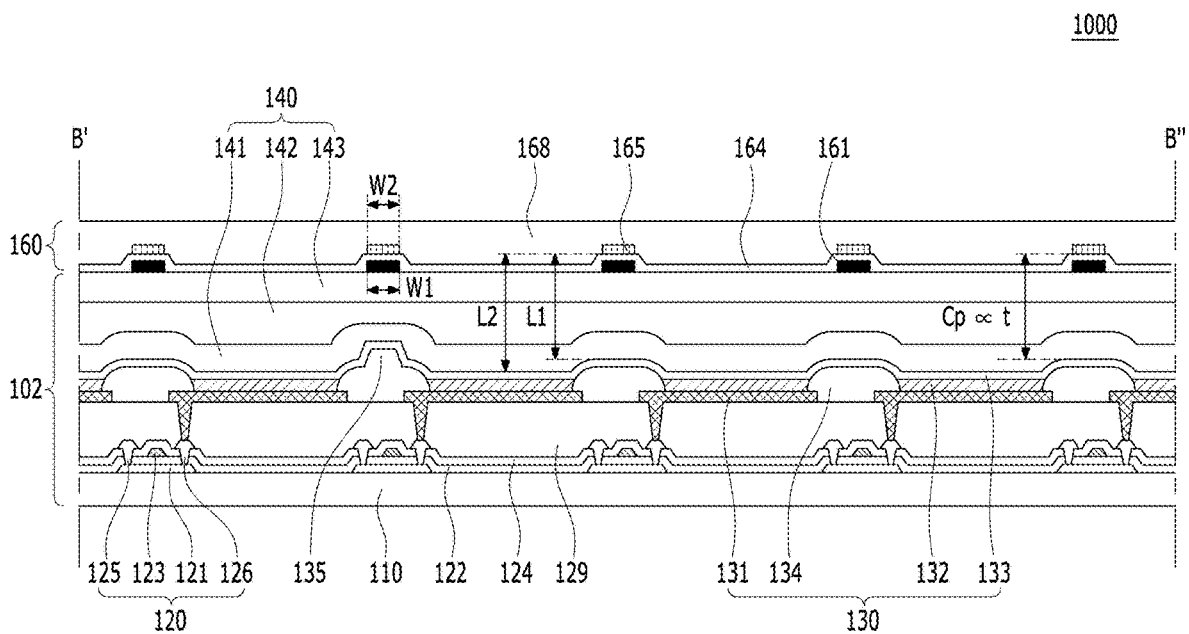
FIG. 5 is a cross-sectional view schematically illustrating a cutting surface B'-B" of a touch sensor according to an embodiment of the disclosure.

FIG. 5 is a cross-sectional view schematically illustrating a cutting surface B'-B" of the touch sensor 160 according to an embodiment of the disclosure.

An electroluminescent display 1000 according to an embodiment of the disclosure is described below with reference to FIGS. 2 to 5.

Referring to FIGS. 4 and 5, the electroluminescent display 1000 according to the embodiment of the disclosure at least includes a display panel 102 and a touch sensor 160.

The display panel 102 at least includes a substrate 110, a transistor 120, an electroluminescent element 130, and an encapsulation unit 140.

The substrate 110 may be made of a material with flexibility characteristics. For example, the substrate 110 may include polyethersulfone, polyacrylate, polyetherimide, polyethylene naphthalate, polyethylene terephthalate, polyphenylene sulfide, polyarylate, polyimide, polycarbonate, photo acrylic, or a polymer resin such as cellulose acetate propionate (CAP). However, embodiments are not limited thereto. For example, the substrate 110 may be made of a glass having flexible characteristics or an insulation-treated metal thin film having flexible characteristics.

The substrate 110 supports various components of the electroluminescent display 1000. The transistor 120 is disposed on the substrate 110. The exemplary transistor 120 shown in FIGS. 4 and 5 may correspond to a structure of the switching transistor T1 and the driving transistor T2 of the exemplary subpixel PXL shown in FIG. 1. FIGS. 4 and 5 illustrate a cross section of the driving transistor T2 by way of example.

The transistor 120 may include a semiconductor layer 121, a gate insulating layer 122 configured to insulate the semiconductor layer 121 from a gate electrode 123, the gate electrode 123 that is disposed on the gate insulating layer 122 and overlaps the semiconductor layer 121, an interlayer dielectric layer 124 configured to insulate the gate electrode 123 from a source electrode 125 and a drain electrode 126, and the source electrode 125 and the drain electrode 126 that are disposed on the interlayer dielectric layer 124 and are electrically connected to the semiconductor layer 121 through a contact hole. A structure of the above-described transistor 120 may be referred to as a transistor having a coplanar structure.

However, the transistor according to embodiments of the disclosure is not limited thereto and may be implemented as a transistor of various structures. For example, the transistor according to embodiments of the disclosure may have an inverted staggered structure.

A planarization layer 129 is disposed on the transistor 120 and planarizes an upper part of the transistor 120. The electroluminescent element 130 and the transistor 120 may be electrically connected to each other through a contact hole of the planarization layer 129. The planarization layer 129 may be formed of an organic material having planarization characteristics. For example, photo acrylic or polyimide, etc, may be used as the organic material.

The electroluminescent element 130 includes an anode electrode 131, an electroluminescent layer 132 formed on the anode electrode 131, and a cathode electrode 133 formed on the electroluminescent layer 132.

The electroluminescent element 130 is connected to the transistor 120 and is configured to receive a current. For example, the anode electrode 131 of the electroluminescent element 130 is connected to the drain electrode 126 of the transistor 120.

The anode electrode 131 is electrically connected to the drain electrode 126 of the transistor 120 exposed through a contact hole penetrating the planarization layer 129. The electroluminescent layer 132 is disposed on the anode electrode 131, of which edges are surrounded by a bank 134. In other words, the bank 134 covers a portion of an outer periphery of the anode electrode 131. A portion of the anode electrode 131 which is not covered by the bank 134 and is exposed may be defined as an emission region of the subpixel. A spacer 135 may be disposed in a portion of the bank 134. The spacer 135 may be formed in such a manner that a height of a portion of the bank 134 increases through a halftone exposure. The spacer 135 may function to support a mask when the electroluminescent layer 132 is formed.

The electroluminescent layer 132 is disposed in the emission region of the subpixel. The electroluminescent layer 132 may have a single-layer structure or a multi-layer structure. For example, the electroluminescent layer 132 may further include a hole transport layer, an electron transport layer, and the like. The electroluminescent layer 132 may include a light emitting material corresponding to a color of the subpixel in order to display an intrinsic color of each subpixel.

When the electroluminescent layer 132 includes an organic material, the electroluminescent element 130 may be referred to as an organic light emitting diode. When the electroluminescent layer 132 includes an inorganic material, the electroluminescent element 130 may be referred to as an inorganic light emitting diode. For example, when the inorganic light emitting diode is formed using a quantum dot material, the electroluminescent element 130 may be referred to as a quantum dot light emitting diode. The electroluminescent layer 132 may be formed individually depending on an intrinsic color of each subpixel. However, embodiments are not limited thereto. For example, if all the subpixels have a white color, light emitting layers of the subpixels may be formed as a common layer. The common layer may mean a layer formed throughout the display area AA.

The hole transport layer and/or the electron transport layer can provide a function of facilitating the movement of holes and electrons for the light emitting layer. The hole transport layer and/or the electron transport layer may be formed as a common layer. However, embodiments are not limited thereto. For example, the hole transport layer and/or the electron transport layer may be selectively applied to individually improve characteristics of each subpixel. In this instance, the hole transport layer and/or the electron transport layer may be formed in a specific portion of the display area AA and may have different thicknesses depending on the subpixels.

The cathode electrode 133 is formed to face the anode electrode 131 with the electroluminescent layer 132 interposed therebetween. When the cathode electrode 133 is formed to cover the display area AA, the cathode electrode 133 may be referred to as a common electrode. In particular, the cathode electrode 133 configured as the common electrode forms a parasitic capacitance Cp together with the touch sensor 160 in the display area AA.

The encapsulation unit 140 may be configured to block moisture or oxygen from penetrating into the electroluminescent element 130 which may be vulnerable to moisture or oxygen. In particular, when the electroluminescent element 130 includes an organic material, the electroluminescent element 130 may be further vulnerable to moisture and oxygen. Therefore, in this instance, the encapsulation unit 140 thus configured can protect the electroluminescent element 130. To this end, the encapsulation unit 140 may at least include a first inorganic encapsulation layer 141, an organic encapsulation layer 142 on the first inorganic encapsulation layer 141, and a second inorganic encapsulation layer 143 on the organic encapsulation layer 142. Namely, the encapsulation unit 140 may include at least two inorganic encapsulation layers 141 and 143 and at least one organic encapsulation layer 142.

Hereinafter, embodiments of the disclosure are described using the encapsulation unit 140, that is configured such that the organic encapsulation layer 142 is sealed between the first inorganic encapsulation layer 141 and the second inorganic encapsulation layer 143, as an example.

The first inorganic encapsulation layer 141 is disposed on the cathode electrode 133. The first inorganic encapsulation layer 141 is configured to seal the plurality of subpixels arranged in the display area AA. Further, the first inorganic encapsulation layer 141 is extended to at least a portion of the non-display area NA. The first inorganic encapsulation layer 141 may be formed of an inorganic insulating material capable of being deposited at a low temperature, for example, silicon nitride (SiNx), silicon oxide (SiOx), silicon oxynitride (SiON), or aluminum oxide ($Al_2O_3$). Hence, because the first inorganic encapsulation layer 141 is deposited in a low temperature atmosphere, the first inorganic encapsulation layer 141 can prevent the electroluminescent layer 132, which is vulnerable to a high temperature atmosphere, from being damaged when the first inorganic encapsulation layer 141 is deposited. For example, when the first inorganic encapsulation layer 141 is formed of silicon nitride (SiNx), a thickness of the first inorganic encapsulation layer 141 may be 0.1 μm to 1.5 μm. However, embodiments are not limited thereto.

The organic encapsulation layer 142 can serve as a buffer for reducing a stress between the respective layers of the electroluminescent display 1000, enhance a planarization performance, and compensate for a foreign substance to improve flatness and quality of the second inorganic encapsulation layer 143. The organic encapsulation layer 142 may be formed of an organic insulating material such as an acrylic resin, an epoxy resin, polyimide, polyethylene, or silicon oxycarbide (SiOC). The organic encapsulation layer 142 may be formed using a chemical vapor deposition method, an inkjet printing method, or a squeegee method. Further, the organic encapsulation layer 142 has an advantage that a thickness can be easily adjusted. Thus, a thickness of the encapsulation unit 140 can be easily adjusted by adjusting the thickness of the organic encapsulation layer 142.

The second inorganic encapsulation layer 143 is configured to seal the organic encapsulation layer 142. In other words, the second inorganic encapsulation layer 143 is configured to cover the organic encapsulation layer 142 and contact the first inorganic encapsulation layer 141 so that the organic encapsulation layer 142 is not exposed to the outside. In particular, when the side of the organic encapsulation layer 142 is exposed to the outside, the organic encapsulation layer 142 may be a penetration path of moisture and oxygen. Therefore, the organic encapsulation layer 142 is configured to be sealed by the first inorganic encapsulation layer 141 and the second inorganic encapsulation layer 143. Thus, the first inorganic encapsulation layer 141 and the second inorganic encapsulation layer 143 are configured to extend more outward than the organic encapsulation layer 142. Hence, the organic encapsulation layer 142 can be sealed, and the first inorganic encapsulation layer 141 and the second inorganic encapsulation layer 143 can contact each other in the non-display area NA. In particular, when the first inorganic encapsulation layer 141 and the second inorganic encapsulation layer 143 are configured to contact each other and seal the organic encapsulation layer 142, they can effectively prevent moisture and oxygen from penetrating into the organic encapsulation layer 142. The second inorganic encapsulation layer 143 may be formed of an inorganic insulating material such as silicon nitride (SiNx), silicon oxide (SiOx), silicon oxynitride (SiON), or aluminum oxide ($Al_2O_3$). For example, when the second inorganic encapsulation layer 143 is formed of silicon nitride (SiNx), a thickness of the second inorganic encapsulation layer 143 may be 0.1 μm to 1.5 μm. However, embodiments are not limited thereto.

Change in flexible or foldable characteristics of the electroluminescent display 1000 depending on the thickness of the encapsulation unit 140 will be described below. The thickness of the encapsulation unit 140 affects flexibility characteristics of the electroluminescent display 1000. For example, as the thickness of the encapsulation unit 140 increases, a tensile stress and a compressive stress applied to each of the first inorganic encapsulation layer 141 and the second inorganic encapsulation layer 143 increase. Therefore, when the electroluminescent display 1000 is bent, there is an increased possibility that a crack will be generated in the encapsulation unit 140. In other words, because the first inorganic encapsulation layer 141 and the second inorganic encapsulation layer 143 mainly perform a function of blocking the penetration of moisture and oxygen, they are relatively harder than the organic encapsulation layer 142.

In a related art, there were attempts to reduce a parasitic capacitance Cp between a touch sensor and a cathode electrode by designing a thick encapsulation unit. For example, the related art could considerably reduce the parasitic capacitance Cp by designing the encapsulation unit to have a thickness of 30 μm or more. However, as described above, when the thickness of the encapsulation unit increases to 30 μm or more, the encapsulation unit may be damaged due to the bending.

Further, in the related art, there were attempts to reduce the parasitic capacitance Cp between the touch sensor and the cathode electrode by providing a pressure sensitive adhesive or an optically clear adhesive resin each having a thickness of 50 μm or more on the encapsulation unit and attaching the touch sensor to the encapsulation unit. However, the attempts might lead to an excessive increase in the thickness of the electroluminescent display and to adversely affecting the flexible or foldable characteristics of the electroluminescent display.

The encapsulation unit 140 of the electroluminescent display 1000 according to the embodiment of the disclosure is designed to have a thickness equal to or greater than 3 μm and equal to or less than 30 μm.

When the thickness of the encapsulation unit 140 is 20 μm to 30 μm, the encapsulation unit 140 can have flexible characteristics.

When the thickness of the encapsulation unit 140 is 15 μm to 20 μm, the flexible characteristics of the encapsulation unit 140 can be further improved. However, a parasitic capacitance Cp between the touch sensor 160 and the cathode electrode 133 when the thickness of the encapsulation unit 140 is 15 μm to 20 μm is relatively greater than a parasitic capacitance Cp between the touch sensor 160 and the cathode electrode 133 when the thickness of the encapsulation unit 140 is equal to or greater than 20 μm and less than 30 μm.

When the thickness of the encapsulation unit 140 is 10 μm to 15 μm, the flexible characteristics of the encapsulation unit 140 can be further improved. However, a parasitic capacitance Cp between the touch sensor 160 and the cathode electrode 133 when the thickness of the encapsulation unit 140 is 10 μm to 15 μm is relatively greater than a parasitic capacitance Cp between the touch sensor 160 and the cathode electrode 133 when the thickness of the encapsulation unit 140 is equal to or greater than 15 μm and less than 20 μm.

When the thickness of the encapsulation unit 140 is 3 μm to 10 am, the flexible characteristics of the encapsulation unit 140 can be further improved. In particular, the thickness of the encapsulation unit 140 is less than 10 μm, the flexibility characteristics of the electroluminescent display 1000 can greatly increase, and thus the electroluminescent display 1000 can have the excellent foldable characteristics. However, a parasitic capacitance Cp between the touch sensor 160 and the cathode electrode 133 when the thickness of the encapsulation unit 140 is 3 μm to 10 μm is relatively greater than a parasitic capacitance Cp between the touch sensor 160 and the cathode electrode 133 when the thickness of the encapsulation unit 140 is equal to or greater than 10 am and less than 15 μm. Hence, touch sensitivity of the touch sensor 160 is sharply reduced, and various problems may occur in the touch sensing of the touch sensor 160.

In other words, when the encapsulation unit 140 is disposed between the touch sensor 160 and the cathode electrode 133 of the electroluminescent display 1000 according to the embodiment of the disclosure, the thickness of the encapsulation unit 140 is a main factor determining a distance between the touch sensor 160 and the cathode electrode 133. In particular, when the low potential voltage VSS is applied to the cathode electrode 133, a parasitic capacitance Cp may be generated between the touch sensor 160 and the cathode electrode 133. The parasitic capacitance Cp increases as the distance between the touch sensor 160 and the cathode electrode 133 decreases. Thus, when the thin profile or the flexibility characteristics of the electroluminescent display 1000 are improved through a reduction in the thickness of the encapsulation unit 140, the parasitic capacitance Cp between the touch sensor 160 and the cathode electrode 133 increases. This may affect an operation of the touch sensor 160. However, the encapsulation unit 140 of the electroluminescent display 1000 according to the embodiment of the disclosure is configured to have as thin a thickness as possible, considering the flexible characteristics of the encapsulation unit 140. Namely, a reduction in the thickness of the encapsulation unit 140 is considered, considering a trade-off between the thickness of the encapsulation unit 140 and the parasitic capacitance Cp.

In addition, as described above, the first inorganic encapsulation layer 141 and the second inorganic encapsulation layer 143 of the encapsulation unit 140 each may have a thickness of 0.1 m to 1.5 m. A thickness of the organic encapsulation layer 142 may have a value obtained by subtracting the thicknesses of the first inorganic encapsulation layer 141 and the second inorganic encapsulation layer 143 from the total thickness of the encapsulation unit 140.

The thickness of the organic encapsulation layer 142 may vary depending on its position in the display area AA. This is caused by the flowability or the planarization characteristics of the organic encapsulation layer 142. More specifically, an upper surface of the organic encapsulation layer 142 (i.e., a contact surface between the organic encapsulation layer 142 and the second inorganic encapsulation layer 143 in the display area AA) may be substantially flat, and a lower surface of the organic encapsulation layer 142 (i.e., a contact surface between the organic encapsulation layer 142 and the first inorganic encapsulation layer 141 in the display area AA) may be substantially uneven. The uneven shape of the organic encapsulation layer 142 may be determined depending on shapes of the electroluminescent element 130, the bank 134, and/or the spacer.

The thickness of the encapsulation unit 140 of the electroluminescent display 1000 according to the embodiment of the disclosure will be described based on a central area of the bank 134 for convenience of explanation. The central area of the bank 134 may indicate a portion of the bank 134 having a maximum height. However, embodiments are not limited thereto. For example, the central area of the bank 134 may indicate a central position between the subpixels adjacent to both sides of the bank 134.

The touch sensor 160 of the electroluminescent display 1000 according to the embodiment of the disclosure is configured such that a distance L1 between the touch sensor 160 and the cathode electrode 133 in the central area of the bank 134 is less than a distance L2 between the touch sensor 160 and the cathode electrode 133 in an emission region of the subpixel. Thus, a parasitic capacitance Cp formed between the cathode electrode 133 on the bank 134 and the touch sensor 160 relatively increases. Namely, because the touch sensor 160 is designed in consideration of a maximum parasitic capacitance, the parasitic capacitance will be described based on the central area of the bank 134. However, embodiments are not limited thereto.

More specifically, the spacer may be formed at a position higher than the bank 134 in a specific portion of the display area AA. However, because an area of the bank 134 is relatively larger than an area of the spacer, the parasitic capacitance will be described based on the bank 134 for convenience of explanation. However, embodiments are not limited thereto. For example, the parasitic capacitance may be described based on the spacer.

In some embodiments, the thickness of the organic encapsulation layer 142 in the non-display area NA may gradually decrease. However, embodiments are not limited thereto.

Some embodiments may use a dam structure for preventing the overcoating or the overflow of an organic encapsulation layer in the non-display area NA. The dam structure may further include additional structures or stepped portions to thereby prevent the overcoating of the organic encapsulation layer. In particular, when the overcoating of the organic encapsulation layer occurs, the organic encapsulation layer may not be sealed by the first inorganic encapsulation layer and the second inorganic encapsulation layer. However, embodiments are not limited thereto.

Some embodiments may further include a crack propagation blocking pattern for blocking the crack propagation of the first inorganic encapsulation layer and the second inorganic encapsulation layer in the non-display area NA. The crack propagation blocking pattern may have, for example, a trench structure. The crack propagation blocking pattern indicates a structure having stepped portions configured to pattern inorganic encapsulation layers at predetermined intervals and block a crack from propagating when the crack occurs. Therefore, the crack propagation blocking pattern can perform a function of blocking the crack propagation in the inorganic encapsulation layer. The crack propagation blocking pattern may be disposed outside the dam structure. However, embodiments are not limited thereto. More specifically, when a crack occurs in the second inorganic encapsulation layer, the crack may propagate and damage the touch sensor 160. However, when the crack propagation blocking pattern is provided as described above, the touch sensor 160 can be protected.

Some embodiments may further include a touch buffer layer between the second inorganic encapsulation layer and a first mesh electrode layer. The touch buffer layer may be a buffer layer for protecting a pad area disposed in the non-display area of the display panel. For example, a data signal and a scan signal for displaying an image on the display area have to be supplied to the non-display area. Therefore, a pad portion for supplying signals to the data lines and the scan lines may be provided. Further, when the touch sensor is formed, it may be necessary to protect the data lines and the scan lines, which have been already formed, during etching and deposition processes for manufacturing first and second mesh electrode layers. Thus, in this instance, the touch buffer layer may be further provided on the second inorganic encapsulation layer. However, embodiments are not limited thereto. The touch buffer layer can function to protect the components of the display panel and may be formed of the same material as the second inorganic encapsulation layer. The touch buffer layer may be deposited to be thinner than the second inorganic encapsulation layer. For example, when a thickness of the second inorganic encapsulation layer is 1 m, a thickness of the touch buffer layer may be 0.1 m. However, embodiments are not limited thereto.

Hereinafter, a structure and an operation method capable of reducing the parasitic capacitance Cp using the touch sensor 160 of the electroluminescent display 1000 according to the embodiment of the disclosure will be described.

Referring again to FIGS. 4 and 5, the touch sensor 160 is disposed on the encapsulation unit 140 of the electroluminescent display 1000 according to the embodiment of the disclosure. The touch sensor 160 at least includes a first mesh electrode layer 161, a first touch insulating layer 164, a second mesh electrode layer 165, and a second touch insulating layer 168.

The first mesh electrode layer 161 is disposed on the encapsulation unit 140. The first mesh electrode layer 161 is disposed to face the cathode electrode 133 with the encapsulation unit 140 interposed therebetween. The first mesh electrode layer 161 may be formed of a metallic conductive material with a low electrical resistance. For example, the first mesh electrode layer 161 may be formed of aluminum (Al), titanium (Ti), copper (Cu), molybdenum (Mo), or an alloy thereof. However, embodiments are not limited thereto. The first mesh electrode layer 161 may have a single-layer structure or a multi-layer structure. For example, the first mesh electrode layer 161 may have a three-layer structure of Ti/Al/Ti or Mo/Al/Mo. When the first mesh electrode layer 161 is formed of the metallic conductive material, the first mesh electrode layer 161 can have excellent flexible characteristics. Therefore, the first mesh electrode layer 161 has an advantage that it can be applied to flexible or foldable displays. Further, because the first mesh electrode layer 161 has the low electrical resistance, the first mesh electrode layer 161 can decrease a width W1 of wires of a first mesh electrode and may be formed in a mesh shape having a width less than a width of the bank 134. Thus, because the first mesh electrode layer 161 does not cover the emission region of the subpixel, an influence of the first mesh electrode layer 161 on quality of an image displayed on the display panel 102 can be minimized. In addition, as the first mesh electrode layer 161 approaches the bank 134, a reduction in image quality at a side viewing angle of the display panel 102 can be minimized.

When the first mesh electrode layer 161 is disposed in the central area of the bank 134, a distance between the first mesh electrode layer 161 and the bank 134 can be minimized. Thus, a parasitic capacitance between the first mesh electrode layer 161 and the cathode electrode 133 can increase. Hence, the first mesh electrode layer 161 may be configured to provide a function of reducing or blocking a parasitic capacitance Cp from being formed between the cathode electrode 133 and the second mesh electrode layer 165.

The first touch insulating layer 164 is disposed on the first mesh electrode layer 161. The first touch insulating layer 164 is configured to function to insulate the first mesh electrode layer 161 from the second mesh electrode layer 165. The first touch insulating layer 164 may be formed of an inorganic layer such as silicon nitride ($SiN_x$), silicon oxide ($SiO_x$), and silicon oxynitride (SiON), or acryl-based, epoxy-based, Parylene-C, Parylene-N, Parylene-F, or siloxane-based organic layer. For example, a thickness of the first touch insulating layer 164 may be 0.01 m to 3 m. However, embodiments are not limited thereto.

The second mesh electrode layer 165 is disposed on the first touch insulating layer 164. The second mesh electrode layer 165 is disposed to face the cathode electrode 133 with the first mesh electrode layer 161 interposed therebetween. The second mesh electrode layer 165 may be formed of a metallic conductive material with a low electrical resistance. For example, the second mesh electrode layer 165 may be formed of aluminum (Al), titanium (Ti), copper (Cu), molybdenum (Mo), or an alloy thereof. However, embodiments are not limited thereto. The second mesh electrode layer 165 may have a single-layer structure or a multi-layer structure. For example, the second mesh electrode layer 165 may have a three-layer structure of Ti/Al/Ti or Mo/Al/Mo. When the second mesh electrode layer 165 is formed of the metallic conductive material, the second mesh electrode layer 165 can have excellent flexible characteristics. Therefore, the second mesh electrode layer 165 has an advantage that it can be applied to flexible or foldable displays. Further, because the second mesh electrode layer 165 has the low electrical resistance, the second mesh electrode layer 165 can decrease a width W2 of wires of a second mesh electrode and may be formed in a mesh shape having a width less than the width of the bank 134. Thus, because the second mesh electrode layer 165 does not shield or cover the emission region of the subpixel, an influence of the second mesh electrode layer 165 on quality of an image displayed on the display panel 102 can be minimized. In addition, as the second mesh electrode layer 165 approaches the bank 134, a reduction in image quality at the side viewing angle of the display panel 102 can be minimized.

A parasitic capacitance Cp formed between the cathode electrode 133 and the second mesh electrode layer 165 is reduced by the first mesh electrode layer 161. Because the first mesh electrode layer 161 is disposed on the bank 134 and between the cathode electrode 133 and the second mesh electrode layer 165, the first mesh electrode layer 161 can reduce or shield the parasitic capacitance Cp that may be generated between the cathode electrode 133 and the second mesh electrode layer 165. Thus, even if the thickness of the encapsulation unit 140 decreases, the second mesh electrode layer 165 can reduce an influence of the parasitic capacitance Cp resulting from the cathode electrode 133. For example, the thickness of the encapsulation unit 140 may be equal to or less than 5 m.

Because the second mesh electrode layer 165 has a mesh shape, an overlap area between the second mesh electrode layer 165 and the cathode electrode 133 can be minimized. As the overlap area between the cathode electrode 133 and the second mesh electrode layer 165 decreases, the parasitic capacitance Cp can be reduced in proportion to the overlap area. Thus, the width W2 of the wires of the second mesh electrode layer 165 can be minimized. Further, as the width W2 of the wires of the second mesh electrode layer 165 is minimized, the flexibility characteristics of the second mesh electrode layer 165 can be improved, and a possibility of cracking of the second mesh electrode layer 165 resulting from the bending can be reduced.

For example, in the display area AA, 80% or more of an area of the second mesh electrode layer 165 may overlap the first mesh electrode layer 161. However, embodiments are not limited thereto.

In other words, when the first and second mesh electrode layers 161 and 165 are vertically aligned on the banks 134, a shielding efficiency of the parasitic capacitance Cp resulting from the cathode electrode 133 can be improved by the first mesh electrode layer 161.

More specifically, when the width W1 of the wire of the first mesh electrode layer 161 is equal to or greater than the width W2 of the wire of the second mesh electrode layer 165, the shielding efficiency of the parasitic capacitance Cp can be improved by the first mesh electrode layer 161. Further, the width W1 of the wire of the first mesh electrode layer 161 may be greater than the width W2 of the wire of the second mesh electrode layer 165 at a level that does not affect the image quality at the side viewing angle of the display panel 102. A degree to which the width W1 of the wire of the first mesh electrode layer 161 is greater than the width W2 of the wire of the second mesh electrode layer 165 may be determined in consideration of the thickness of the encapsulation unit 140 and the side viewing angle of the display panel 102. Namely, the widths W1 and W2 of the wires of the first and second mesh electrode layers 161 and 165 may increase as the thickness of the encapsulation unit 140 decreases, and the widths W1 and W2 may increase to a degree that the side viewing angle of the display panel 102 is reduced.

In addition, the width W1 of the wire of the first mesh electrode layer 161 and the width W2 of the wire of the second mesh electrode layer 165 may be individually determined depending on the thickness of the encapsulation unit 140.

For example, as the thickness of the encapsulation unit 140 decreases, the parasitic capacitance Cp between the cathode electrode 133 and the second mesh electrode layer 165 increases. However, when the width W2 of the wire of the second mesh electrode layer 165 decreases, the overlap area between the cathode electrode 133 and the second mesh electrode layer 165 can decrease. Hence, an increase in the parasitic capacitance Cp can be suppressed. However, as the width W2 of the wire of the second mesh electrode layer 165 decreases, a wire resistance (Q) of the second mesh electrode layer 165 increases. Therefore, the width W2 of the wire of the second mesh electrode layer 165 has to be designed to have the wire resistance (Q) at a level that the touch sensing can be performed. For example, the width W2 of the wire of the second mesh electrode layer 165 may be 1.5 m to 10 m. However, embodiments are not limited thereto.

Further, when the width W1 of the wire of the first mesh electrode layer 161 is designed to be greater than the width W2 of the wire of the second mesh electrode layer 165, an overlap area between the cathode electrode 133 and the first mesh electrode layer 161 can increase. Hence, the first mesh electrode layer 161 can increase a shielding level of the parasitic capacitance Cp between the cathode electrode 133 and the second mesh electrode layer 165. However, as the width W1 of the wire of the first mesh electrode layer 161 increases, the first mesh electrode layer 161 is close to the emission region of the subpixel. Therefore, the width W1 of the wire of the first mesh electrode layer 161 has to be designed to increase at a level that does not affect the side viewing angle of the display panel 102. For example, the width W1 of the wire of the first mesh electrode layer 161 may be 1.5 m to 12 m. However, embodiments are not limited thereto.

In other words, the electroluminescent element 130 includes the cathode electrode 133. A distance between the common electrode and the first mesh electrode layer may be 3 m to 30 m, and a distance between the first mesh electrode layer and the second mesh electrode layer may be 0.01 m to 3 m.

A portion of the first mesh electrode layer 161 and a portion of the second mesh electrode layer 165 are electrically connected to each other through a contact hole CNT of the first touch insulating layer 164.

The second touch insulating layer 168 is disposed on the second mesh electrode layer 165. The second touch insulating layer 168 is configured to cover the second mesh electrode layer 165. The second touch insulating layer 168 may be formed of an inorganic layer such as silicon nitride (SiNx), silicon oxide (SiOx), and silicon oxynitride (SiON), or acryl-based, epoxy-based, Parylene-C, Parylene-N, Parylene-F, or siloxane-based organic layer. The second touch insulating layer 168 prevents corrosion of the second mesh electrode layer 165 or insulates the second mesh electrode layer 165. However, embodiments are not limited thereto, and the second touch insulating layer 168 may be omitted, if necessary or desired.

In some embodiments, various functional layers including a protective film, an antistatic film, a polarizing film, an external light absorbing film, a protective glass, etc. may be further provided on the touch sensor 160.

Referring again to FIGS. 2 and 3, the touch sensor 160 of the electroluminescent display 1000 according to the embodiment of the disclosure is described.

The first mesh electrode layer 161 includes a first opening OP1 and a first disconnection portion CUT1 when viewed from the plane. The second mesh electrode layer 165 includes a second opening OP2 and a second disconnection portion CUT2 when viewed from the plane.

The first opening OP1 and the second opening OP2 are configured to surround the emission region of the subpixel. As an example of the emission region of the subpixel, a red emission region R, a green emission region G, and a blue emission region B are shown in FIGS. 2 and 3. However, the color of the emission region is not limited thereto and may be variously changed depending on wavelength characteristics of the electroluminescent layer of the subpixel. In addition, FIGS. 2 and 3 illustrate the emission regions having a rhombic or diamond shape, by way of example. However, embodiments are not limited thereto. For example, the emission region may have various shapes including a triangle, a rectangle, a polygon, an oval, and a circle, etc.

The first disconnection portion CUT1 indicates an area where a portion of the first mesh electrode layer 161 is disconnected. Specifically, the first mesh electrode layer 161 may be divided into a first mesh electrode 162 and a second mesh electrode 163 by the first disconnection portion CUT1. The first mesh electrode 162 and the second mesh electrode 163 are electrically insulated from each other by the first disconnection portion CUT1. The first disconnection portion CUT1 may have a specific disconnection pattern. Namely, shapes of the first mesh electrode 162 and the second mesh electrode 163 may be determined by the disconnection pattern of the first disconnection portion CUT1.

The second disconnection portion CUT2 indicates an area where a portion of the second mesh electrode layer 165 is disconnected. Specifically, the second mesh electrode layer 165 may be divided into a third mesh electrode 166 and a fourth mesh electrode 167 by the second disconnection portion CUT2. The third mesh electrode 166 and the fourth mesh electrode 167 are electrically insulated from each other by the second disconnection portion CUT2. The second disconnection portion CUT2 may have a specific disconnection pattern different from the first disconnection portion CUT1. Namely, shapes of the third mesh electrode 166 and the fourth mesh electrode 167 may be determined by the disconnection pattern of the second disconnection portion CUT2.

The first mesh electrode 162 and the second mesh electrode 163 each include the plurality of first openings OP1, and the emission region of the subpixel is disposed in each first opening OP1. The third mesh electrode 166 and the fourth mesh electrode 167 each include the plurality of second openings OP2, and the emission region of the subpixel is disposed in each second opening OP2. Namely, an emission region of one subpixel may be disposed corresponding to the first opening OP1 and the second opening OP2.

When the width W1 of the wire of the first mesh electrode layer 161 is equal to the width W2 of the wire of the second mesh electrode layer 165, an area of the first opening OP1 and an area of the second opening OP2 may be equal to each other. Further, when the width W1 of the wire of the first mesh electrode layer 161 is greater than the width W2 of the wire of the second mesh electrode layer 165, an area of the first opening OP1 may be less than an area of the second opening OP2.

In other words, the first mesh electrode layer 161 may include the first opening OP1 and the first disconnection portion CUT1, the second mesh electrode layer 165 may include the second opening OP2 and the second disconnection portion CUT2, and the electroluminescent element 130 may be disposed in the first opening OP1 and the second opening OP2 or in the first disconnection portion CUT1 and the second disconnection portion CUT2.

The first mesh electrode 162, the second mesh electrode 163, the third mesh electrode 166, and the fourth mesh electrode 167 overlap the bank 134 and are arranged along a central portion between the adjacent emission regions. Namely, the shape of the mesh electrodes corresponds to the shape of the emission region of the subpixel. The mesh electrodes may be disposed on the bank 134 without covering the emission region and thus do not affect the image quality of the display panel 102.

A first wire portion 169 connected to the first mesh electrode layer 161 and a second wire portion 170 connected to the second mesh electrode layer 165 are disposed in the non-display area NA. The first touch insulating layer 164 may be disposed between the first wire portion 169 and the second wire portion 170. The first wire portion 169 and the second wire portion 170 are connected to a pad portion PAD. The touch sensor 160 may be electrically connected to a circuit unit through the pad portion PAD.

Examples of the circuit unit may include a timing controller integrated circuit (IC) configured to supply an image signal, a data driver IC, a power IC configured to supply power, a power supply unit, a DC-DC converter, or a touch driver. The circuit unit may be configured to supply a specific voltage or a specific waveform signal.

For example, the circuit unit may be the touch driver. The touch driver may be configured to apply a driving signal to the third mesh electrode 166 and receive a sensing signal from the fourth mesh electrode 167, thereby obtaining whether or not a touch operation is performed and touch position information.

For example, the touch driver may be configured to sequentially perform a mutual capacitance sensing drive and a self-capacitance sensing drive.

For example, the circuit unit may be the power supply unit. The power supply unit may supply a specific common voltage or a specific pulse signal to the second mesh electrode 163.

The first wire portion 169 may be formed of the same material as the first mesh electrode layer 161. The first wire portion 169 may be formed at the same time as the first mesh electrode layer 161. However, embodiments are not limited thereto. The second wire portion 170 may be formed of the same material as the second mesh electrode layer 165. The second wire portion 170 may be formed at the same time as the second mesh electrode layer 165. However, embodiments are not limited thereto. The pad portion PAD may be formed of the same material as the first mesh electrode layer 161 and/or the second mesh electrode layer 165. The pad portion PAD may be formed at the same time as the first mesh electrode layer 161 and/or the second mesh electrode layer 165. However, embodiments are not limited thereto.

In the touch sensor 160 of the electroluminescent display 1000 according to the embodiment of the disclosure, the first wire portion 169 composed of one wire is shown for convenience of explanation. However, embodiments are not limited thereto. For example, the number of first wire portions 169 is not limited, and the first wire portion 169 may further include a plurality of wires for the supply of a constant voltage.

The third mesh electrode 166 and the fourth mesh electrode 167 are described below.

The second mesh electrode layer 165 is divided into a plurality of blocks and is configured to sense a touch input. The first mesh electrode layer 161 is divided into a plurality of blocks and is configured to perform a bridge function of connecting some of the plurality of blocks of the second mesh electrode layer 165 while reducing the parasitic capacitance Cp between the cathode electrode 133 and the second mesh electrode layer 165.

The second mesh electrode layer 165 is configured to generate a capacitance and sense a touch input.

The third mesh electrode 166 is configured to at least serve as a driving electrode of the touch sensor 160. The third mesh electrode 166 is arranged in a second direction (for example, Y-axis direction). The third mesh electrode 166 includes a plurality of channels, and each channel is connected to the second wire portion 170 in the non-display area NA. The second wire portion 170 is connected to the pad part PAD. The third mesh electrode 166 may be electrically connected to the touch driver through the pad portion PAD.

The fourth mesh electrode 167 is configured to at least serve as a sensing electrode of the touch sensor 160. Namely, the second mesh electrode layer 165 may be configured to generate a capacitance and sense a touch input. The fourth mesh electrode 167 is arranged in a first direction (for example, X-axis direction). The fourth mesh electrode 167 includes a plurality of channels, and each channel is connected to the second wire portion 170 in the non-display area NA. The second wire portion 170 is connected to the pad portion PAD. The fourth mesh electrode 167 may be electrically connected to the touch driver through the pad portion PAD. Namely, the fourth mesh electrode 167 is divided into a plurality of island shapes by the second disconnection portion CUT2. The islands may be referred to as blocks. However, embodiments are not limited thereto.

A contact hole CNT is formed in the fourth mesh electrode 167 at an intersection of the third mesh electrode 166 and the fourth mesh electrode 167. The blocks of the fourth mesh electrode 167 are connected in the first direction (X-axis) through the bridge function of the first mesh electrode layer 161.

A mutual capacitance or a self-capacitance which may be used for touch sensing is generated by the arrangement of the third and fourth mesh electrodes 166 and 167 and the driving signals. For example, the third mesh electrode 166 and the fourth mesh electrode 167 intersect each other to thereby generate the mutual capacitance. Thus, the mutual capacitance can perform as a function of the touch sensor 160 by charging electric charges in response to a touch driving pulse signal supplied to the third mesh electrode 166 and discharging the charged electric charges to the fourth mesh electrode 167.

The first mesh electrode 162 and the second mesh electrode 163 are described below.

The first mesh electrode 162 is configured to perform abridge function of electrically connecting the blocks of the fourth mesh electrode 167. Namely, the first mesh electrode 162 contacts the fourth mesh electrode 167 adjacent to the first mesh electrode 162 through the contact hole CNT and intersects the third mesh electrode 166 extended in the second direction. The first mesh electrode 162 is electrically insulated from the second mesh electrode 163 by the first disconnection portion CUT1.

The electroluminescent element 130 includes a common electrode, and the first mesh electrode 162 and the common electrode are configured to generate a capacitance.

The second mesh electrode 163 is configured to serve as a shielding electrode of the touch sensor 160. The second mesh electrode 163 is disposed such that the third mesh electrode 166 and the fourth mesh electrode 167 directly face the cathode electrode 133 in as small an area as possible. In other words, the second mesh electrode 163 is disposed to overlap at least a portion of the third mesh electrode 166 and at least a portion of the fourth mesh electrode 167. According to the above-described configuration, the parasitic capacitance Cp between the cathode electrode 133 and the second mesh electrode layer 165 can be reduced.

The second mesh electrode 163 is composed of a single channel or a common electrode and is connected to the first wire portion 169 in the non-display area NA. Thus, a floating voltage or a specific voltage is applied to the second mesh electrode 163. Because the second mesh electrode 163 shields at least a portion of the third mesh electrode 166 and at least a portion of the fourth mesh electrode 167, the parasitic capacitance resulting from the cathode electrode 133 can be reduced. Thus, the second mesh electrode 163 may be referred to as a shielding electrode, a parasitic capacitance reduction electrode, or the like. However, embodiments are not limited thereto.

In other words, the electroluminescent display 1000 according to an embodiment of the disclosure may include an electroluminescent element disposed in a display area of a substrate, an encapsulation unit disposed on the electroluminescent element, a first mesh electrode layer disposed on the encapsulation unit, an insulating layer covering the first mesh electrode layer, and a second mesh electrode layer disposed on the insulating layer. The first mesh electrode layer may include a first mesh electrode and a second mesh electrode separated from the first mesh electrode. The second mesh electrode layer may include a third mesh electrode extended in a first direction and a fourth mesh electrode extended in a second direction intersecting the first direction through the first mesh electrode intersecting the third mesh electrode.

In other words, a flexible electroluminescent display according to an embodiment of the disclosure includes a flexible substrate, a transistor positioned on the flexible substrate, an anode electrode positioned on the transistor, a bank surrounding the anode electrode, an electroluminescent layer positioned on the anode electrode, a cathode electrode positioned on the electroluminescent layer, a flexible encapsulation unit positioned on the cathode electrode, a first mesh electrode layer positioned on the flexible encapsulation unit and configured to overlap the bank and generate a first capacitance together with the cathode electrode, an insulating layer covering the first mesh electrode layer, and a second mesh electrode layer positioned on the insulating layer and configured to overlap the first mesh electrode layer and generate a second capacitance together with the first mesh electrode layer.

The first disconnection portion CUT1 may have an X-shape and/or an oval shape when viewed from the plan view of the touch sensor 160 of the electroluminescent display 1000 according to the embodiment of the disclosure. However, the X-shape of the first disconnection portion CUT1 corresponds to the shape of the second disconnection portion CUT2 of the second mesh electrode layer 165, and at the same time has a structure derived to connect areas other than a bridge area as one electrode while optimizing an overlap area between the first disconnection portion CUT1 and the third and fourth mesh electrodes 166 and 167. Thus, the shape of the first disconnection portion CUT1 may be configured to correspond to the shape of the second disconnection portion CUT2. However, embodiments are not limited thereto. For example, when there is a change in the shape of the second disconnection portion CUT2, the shape of the first disconnection portion CUT1 may be changed corresponding to the changed shape of the second disconnection portion CUT2. The above-described configuration has an advantage that the first mesh electrode 162 connecting the blocks of the fourth mesh electrode 167 and the second mesh electrode 163 shielding the third and fourth mesh electrodes 166 and 167 can be simultaneously formed by patterning the first mesh electrode layer 161.

In the touch sensor 160 of the electroluminescent display 1000 according to the embodiment of the disclosure, a width of the first disconnection portion CUT1 is greater than a width of the second disconnection portion CUT2. According to the above-described structure, when the touch sensor 160 is bent, a stress caused by the bending can be reduced.

The electroluminescent display 1000 according to the embodiment of the disclosure does not require a process for attaching a touch screen to the electroluminescent display 1000 using an adhesive. Namely, the electroluminescent display 1000 according to the embodiment of the disclosure does not require a separate attaching process by sequentially stacking the first mesh electrode layer 161 and the second mesh electrode layer 165 on the encapsulation unit 140, thereby simplifying the manufacturing process and reducing the manufacturing cost.

Figure 6:
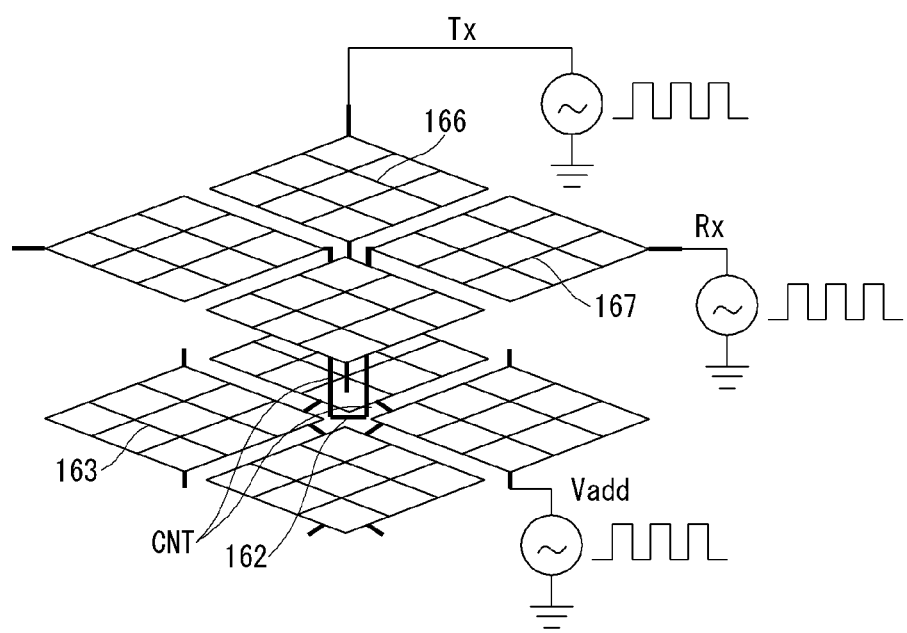
FIG. 6 is a conceptual diagram schematically illustrating a drive of a touch sensor according to an embodiment of the disclosure.
Figure 7:
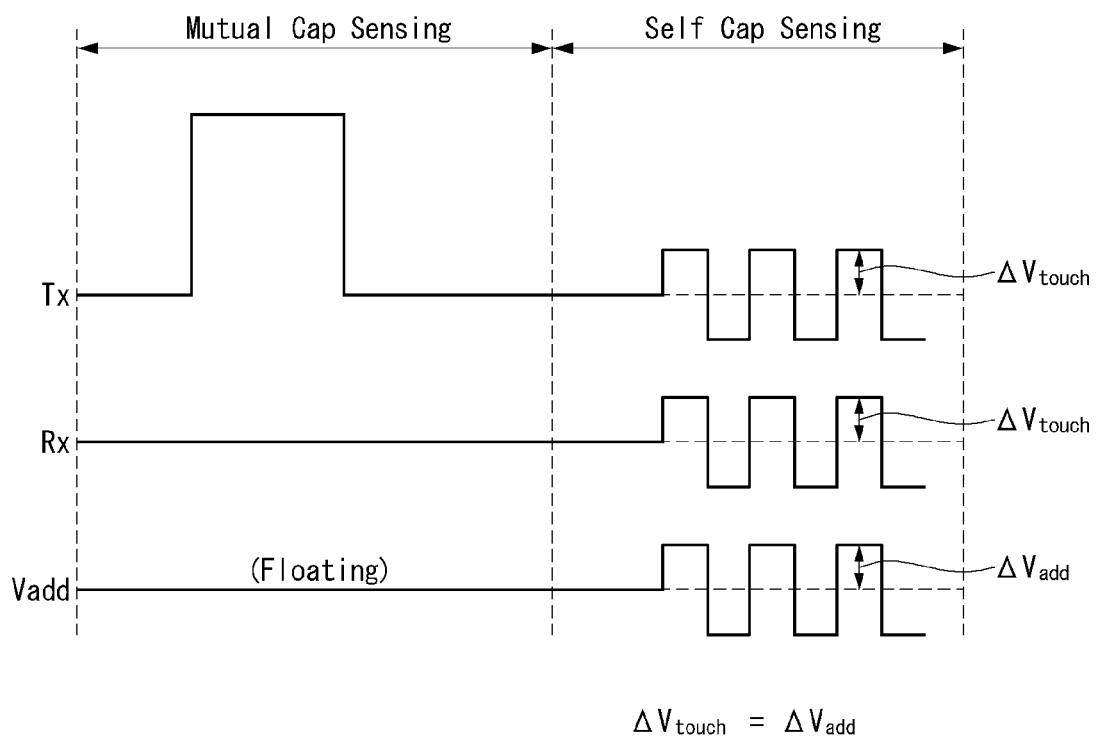
FIG. 7 is a waveform diagram schematically illustrating a drive of a touch sensor according to an embodiment of the disclosure.

With reference to FIGS. 6 and 7, an operation of the touch sensor 160 of the electroluminescent display 1000 according to the embodiment of the disclosure is described below.

FIG. 6 is a conceptual diagram schematically illustrating a drive of a touch sensor according to an embodiment of the disclosure.

More specifically, FIG. 6 is a conceptual diagram schematically illustrating an electrical connection of blocks of each mesh electrode for convenience of explanation. The touch sensor 160 of the electroluminescent display 1000 according to the embodiment of the disclosure receives a touch driving signal Tx to be supplied to the third mesh electrode 166 from the circuit unit (for example, the touch driver for sensing a mutual capacitance). The touch driver receives a touch sensing signal Rx from the fourth mesh electrode 167 and determines whether or not a touch operation is performed. The first mesh electrode 162 performs a bridge function of connecting the fourth mesh electrode 167, which is divided into a plurality of parts, through the contact hole CNT.

The second mesh electrode 163 vertically corresponds to the third mesh electrode 166 and the fourth mesh electrode 167. The second mesh electrode 163 is configured to shield the cathode electrode 133 and thus reduces a parasitic capacitance resulting from the cathode electrode 133. The second mesh electrode 163 receives a shielding signal Vadd.

Namely, a parasitic capacitance Cp between the cathode electrode 133 and the third and fourth mesh electrodes 166 and 167 can be minimized by the shielding of the second mesh electrode 163.

In embodiments disclosed herein, a plurality of subpixels may include red subpixels, green subpixels, and blue subpixels. The subpixels may be separated from one another by the bank, and the first mesh electrode layer and the second mesh electrode layer may be vertically aligned on the bank.

The electroluminescent display 1000 includes a touch driver electrically connected to the first mesh electrode layer 161 and the second mesh electrode layer 165. The touch driver may be configured to apply a predetermined voltage to each of the first mesh electrode layer 161 and the second mesh electrode layer 165. Thus, when a first capacitance increases due to the predetermined voltage, a second capacitance may be reduced.

The second mesh electrode layer 165 may include a plurality of touch electrodes disposed along a first direction and a second direction intersecting the first direction, and the first mesh electrode layer 161 may include a plurality of active shielding electrodes. The active shielding electrodes are disposed along the first direction and may be implemented by a touch sensor integrated display.

FIG. 7 is a waveform diagram schematically illustrating a drive of a touch sensor according to an embodiment of the disclosure.

The touch sensor 160 of the electroluminescent display 1000 according to the embodiment of the disclosure is configured to operate in at least one sensing mode.

For example, the touch sensor 160 may operate to sense a mutual capacitance, sense a self-capacitance, or sequentially sense a mutual capacitance and a self-capacitance.

Namely, the third mesh electrode 166 and the fourth mesh electrode 167 may be configured to operate using at least one of a mutual capacitance sensing method and a self-capacitance sensing method. The second mesh electrode 163 may be configured to operate corresponding to at least one sensing method.

The mutual capacitance may be sensed in a mutual capacitance sensing period Mutual Cap Sensing. The self-capacitance may be sensed in a self-capacitance sensing period Self-Cap Sensing.

FIG. 7 is merely an example of a waveform diagram. The electroluminescent display 1000 according to the embodiment of the disclosure may operate in only the mutual capacitance sensing period and also operate in only the self-capacitance sensing period. In addition, when the mutual capacitance and the self-capacitance are sequentially sensed, a touch noise such as ghost can be removed. Hence, the electroluminescent display 1000 according to the embodiment of the disclosure can achieve better touch sensitivity.

The mutual capacitance sensing period Mutual Cap Sensing is described below.

The second mesh electrode 163 of the touch sensor 160 of the electroluminescent display 1000 according to the embodiment of the disclosure is configured to receive the shielding signal Vadd through the first wire portion 169 in the mutual capacitance sensing period. The shielding signal Vadd may be set to a floating voltage capable of reducing a difference between a voltage of the touch driving signal Tx and a voltage of the cathode electrode.

The touch driver can control the second mesh electrode 163 to be in a floating voltage state.

The voltage of the cathode electrode of the electroluminescent display 1000 according to the embodiment of the disclosure is the low potential voltage VSS.

A pulse voltage of the touch driving signal Tx may include a low potential voltage (e.g., 0 V) and a high potential voltage (e.g., 15 V). For example, the voltage of the cathode electrode may be −4V to 0V. However, embodiments are not limited thereto. Further, the voltage of the cathode electrode may be fixed or may vary within a predetermined range. For example, the voltage of the cathode electrode may be controlled depending on a dimming level of the display panel 102 for the purpose of reducing power consumption.

In the mutual capacitance sensing period Mutual Cap Sensing, the shielding signal Vadd is supplied as the floating voltage.

Because the third mesh electrode 166 and the fourth mesh electrode 167 overlap the second mesh electrode 163, the third mesh electrode 166 and the fourth mesh electrode 167 are not directly affected by the voltage of the cathode electrode. The third mesh electrode 166 and the fourth mesh electrode 167 are directly affected by the shielding signal Vadd. Because the shielding signal Vadd is in a floating state, the shielding signal Vadd can shield the parasitic capacitance resulting from the cathode electrode and at the same time cannot have a special influence on the second mesh electrode layer 165.

More specifically, a reduction in the touch sensitivity resulting from the parasitic capacitance Cp between the second mesh electrode layer 165 and the cathode electrode 133 may be proportional to a potential difference between the second mesh electrode layer 165 and the cathode electrode 133. Namely, as the potential difference increases, the touch sensitivity of the touch sensor 160 may be reduced. However, when the second mesh electrode 163 is floated between the voltage of the cathode electrode 133 and the third mesh electrode 166, the touch sensitivity of the touch sensor 160 can be improved.

The self-capacitance sensing period Self-Cap Sensing is described below.

The second mesh electrode 163 of the touch sensor 160 of the electroluminescent display 1000 according to the embodiment of the disclosure is configured to receive the shielding signal Vadd through the first wire portion 169 in the self-capacitance sensing period Self-Cap Sensing. The shielding signal Vadd in the self-capacitance sensing period Self-Cap Sensing is synchronized with a self-capacitance sensing touch driving signal Tx applied to the third mesh electrode 166 and a self-capacitance sensing touch driving signal Rx applied to the fourth mesh electrode 167. In other words, the voltage of the shielding signal Vadd may have substantially the same voltage as the self-capacitance sensing touch driving signal Rx.

In the self-capacitance sensing period Self-Cap Sensing, pulses, in which a first touch signal Tx, a second touch sensing signal Rx, and the shielding signal Vadd are synchronized, are supplied to the third mesh electrode 166. In other words, in the self-capacitance sensing method, the channels of each touch electrode do not dividedly operate as the driving electrode and the sensing electrode. Namely, embodiments are not limited to the names of the touch driving signal Tx and the touch sensing signal Rx. In the self-capacitance sensing period Self-Cap Sensing, the touch driving signal Tx and the touch sensing signal Rx may mean signals configured to sense the self-capacitance of channels of the third mesh electrode 166 and the self-capacitance of channels of the fourth mesh electrode 167 in the touch sensor 160.

According to the driving method described above, because the shielding signal Vadd operates synchronously with the first touch signal Tx and the second touch signal Rx, a voltage between the first mesh electrode layer 161 and the second mesh electrode layer 165 may be substantially uniform in the self-capacitance sensing period Self-Cap Sensing. Further, a potential difference between the first and second mesh electrode layers 161 and 165 may be substantially eliminated. Because the second mesh electrode 163 is synchronized with the signals applied to the third mesh electrode 166 and the fourth mesh electrode 167 while shielding the parasitic capacitance Cp, the third mesh electrode 166 and the fourth mesh electrode 167 are not substantially affected by the second mesh electrode 163. Thus, the touch sensitivity of the touch sensor 160 can be improved.

In other words, the electroluminescent display 1000 according to an embodiment of the disclosure includes a substrate, a plurality of subpixels disposed on the substrate and including a plurality of circuit units configured to supply an image signal and an electroluminescent diode electrically connected to the plurality of circuit units, an encapsulation unit configured to cover the plurality of subpixels, a first mesh electrode layer that is disposed on the encapsulation unit and is divided into a plurality of areas by a predetermined disconnection pattern, an insulating layer covering the first mesh electrode layer, and a second mesh electrode layer that is disposed on the insulating layer and is divided into a plurality of areas by a predetermined disconnection pattern. A shape of the predetermined disconnection pattern of the first mesh electrode layer may be different from a shape of the predetermined disconnection pattern of the second mesh electrode layer. At least a portion of the first mesh electrode layer and at least a portion of the second mesh electrode layer may be configured to receive the same signal.

A parasitic capacitance between the plurality of subpixels and the second mesh electrode layer can be reduced by the same signal or a synchronized signal.

Figure 8:
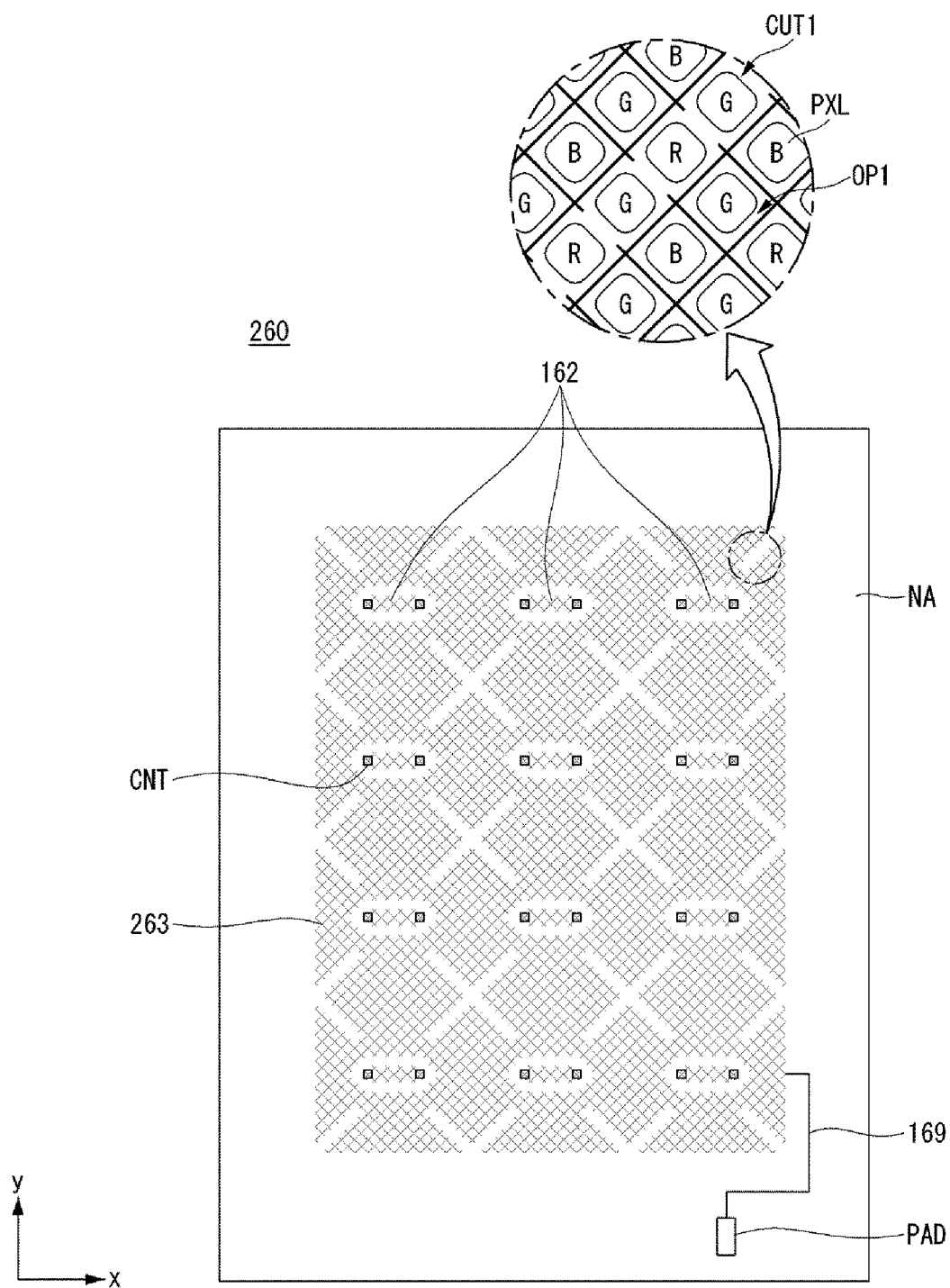
FIG. 8 is a plan view schematically illustrating a second mesh electrode layer of a touch sensor in an electroluminescent display according to another embodiment of the disclosure.

FIG. 8 is a plan view schematically illustrating a second mesh electrode layer of a touch sensor in an electroluminescent display according to another embodiment of the disclosure.

Description of structures and components identical or equivalent to those described above may be briefly made or may be entirely omitted for convenience of explanation.

There is a difference between a touch sensor 260 of an electroluminescent display according to another embodiment of the disclosure and the touch sensor 160 of the electroluminescent display 1000 according to the embodiment of the disclosure in a shape of a first mesh electrode layer or a shape of a first disconnection portion CUT1.

A first mesh electrode 162 of FIG. 8 is substantially the same as the first mesh electrode 162 of FIG. 2, and thus a duplicated description will be omitted for brevity. A width of a first disconnection portion CUT1 in a second mesh electrode 263 of FIG. 8 is less than a width of the first disconnection portion CUT1 in the second mesh electrode 163 of FIG. 2. More specifically, the width of the first disconnection portion CUT1 shown in FIG. 8 is substantially the same as a width of the second disconnection portion CUT2 shown in FIG. 2. According to the above-described configuration, the width of the first disconnection portion CUT1 and a width of the second disconnection portion CUT2 in FIG. 8 may be substantially same as each other. In this instance, a shielding area of the first mesh electrode layer of FIG. 8 can further increase, compared to the first disconnection portion CUT1 shown in FIG. 3. Hence, a shielding performance can be further improved.

Figure 9:
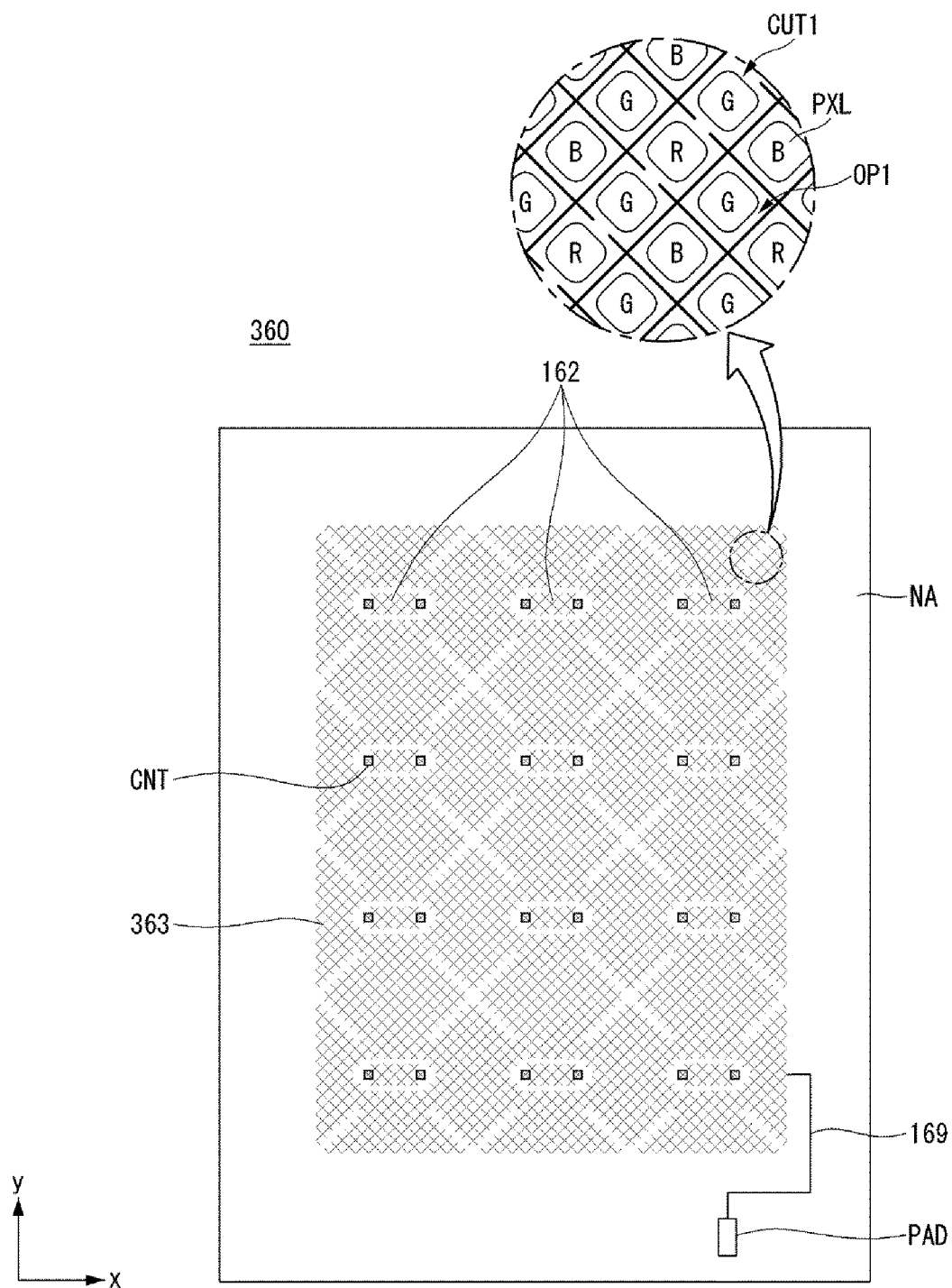
FIG. 9 is a plan view schematically illustrating a second mesh electrode layer of a touch sensor in an electroluminescent display according to another embodiment of the disclosure.

FIG. 9 is a plan view schematically illustrating a second mesh electrode layer of a touch sensor in an electroluminescent display according to another embodiment of the disclosure.

Description of structures and components identical or equivalent to those described above may be briefly made or may be entirely omitted for convenience of explanation.

There is a difference between a touch sensor 360 of an electroluminescent display according to another embodiment of the disclosure and the touch sensor 160 of the electroluminescent display 1000 according to the embodiment of the disclosure in a shape of a first mesh electrode layer or a shape of a first disconnection portion CUT1.

A first mesh electrode 162 of FIG. 9 is substantially the same as the first mesh electrode 162 of FIG. 2, and thus a duplicated description will be omitted for brevity. A width of a first disconnection portion CUT1 in a second mesh electrode 363 of FIG. 9 is less than the width of the first disconnection portion CUT1 in the second mesh electrode 263 of FIG. 8. More specifically, the width of the first disconnection portion CUT1 shown in FIG. 9 is less than the width of the second disconnection portion CUT2 shown in FIG. 2. In this instance, a shielding area of the first mesh electrode layer of FIG. 9 can further increase, compared to the first disconnection portion CUT1 shown in FIG. 8. Hence, a shielding performance can be further improved.

Figure 10:
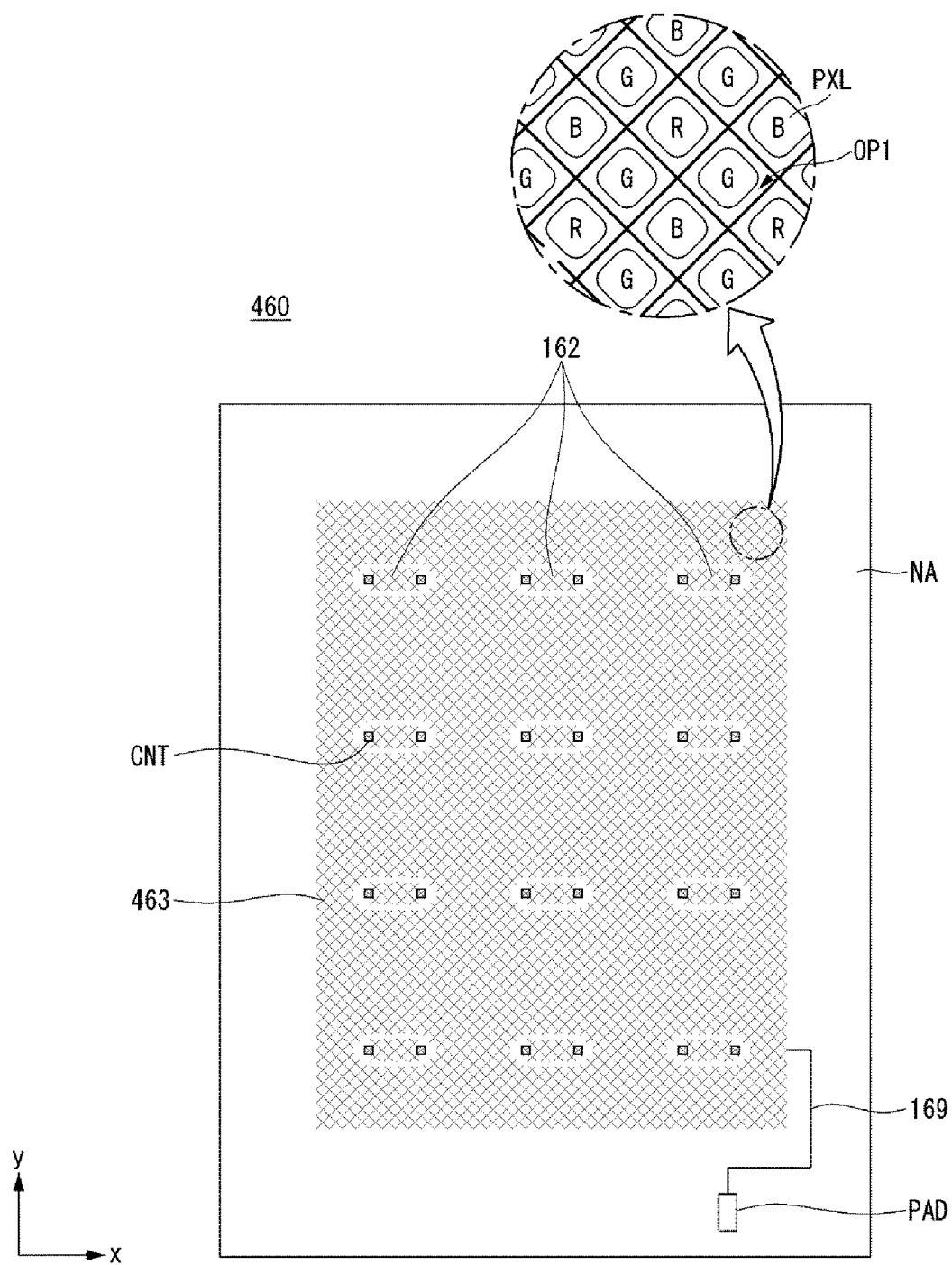
FIG. 10 is a plan view schematically illustrating a second mesh electrode layer of a touch sensor in an electroluminescent display according to another embodiment of the disclosure.

FIG. 10 is a plan view schematically illustrating a second mesh electrode layer of a touch sensor in an electroluminescent display according to another embodiment of the disclosure.

Description of structures and components identical or equivalent to those described above may be briefly made or may be entirely omitted for convenience of explanation.

There is a difference between a touch sensor 460 of an electroluminescent display according to another embodiment of the disclosure and the touch sensor 160 of the electroluminescent display 1000 according to the embodiment of the disclosure in a shape of a first mesh electrode layer.

A first mesh electrode 162 of FIG. 10 is substantially the same as the first mesh electrode 162 of FIG. 2, and thus a duplicated description will be omitted for brevity. A second mesh electrode 463 of FIG. 10 is configured such that all of a remaining area excluding a bridge area from the second mesh electrode 463 includes a mesh electrode without including a disconnection portion. In this instance, a shielding area of the first mesh electrode layer of FIG. 10 can further increase, compared to the second disconnection portion CUT2 shown in FIG. 9. Hence, a shielding performance can be further improved.

With reference to FIGS. 8 to 10, the shielding performance depending on the area of the first mesh electrode layer was described above. As described above, as the shielding area increases, the shielding characteristics can be further improved. When the first disconnection portion CUT1 is designed to correspond to the second disconnection portion CUT2, the flexibility characteristics can be improved when the electroluminescent display is bent.

Figure 11:
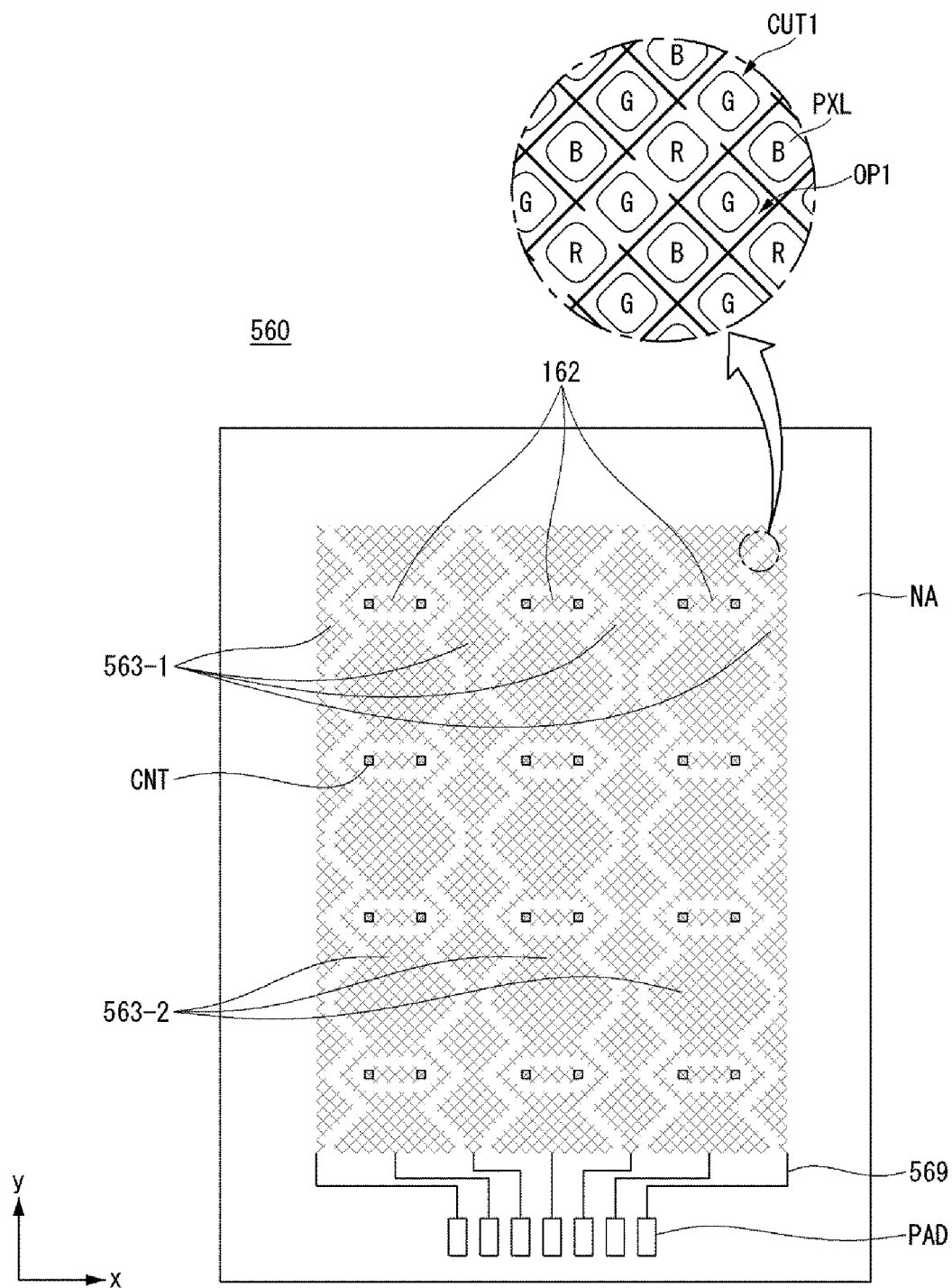
FIG. 11 is a plan view schematically illustrating a second mesh electrode layer of a touch sensor in an electroluminescent display according to another embodiment of the disclosure.
Figure 12:
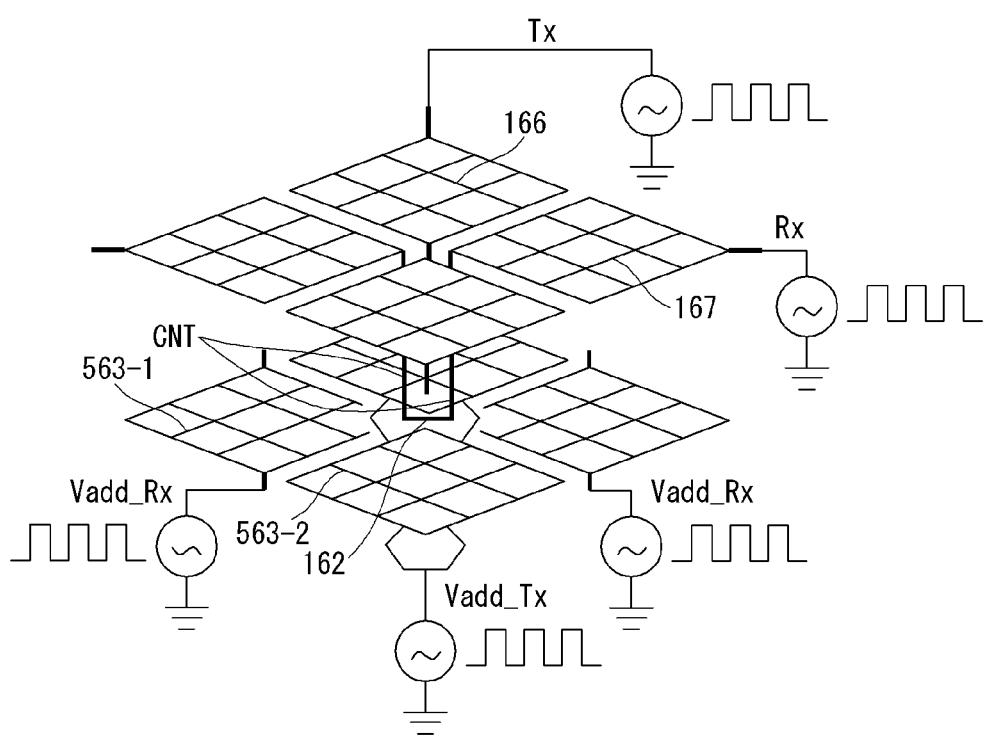
FIG. 12 is a conceptual diagram schematically illustrating a drive of a touch sensor according to another embodiment of the disclosure.
Figure 13:
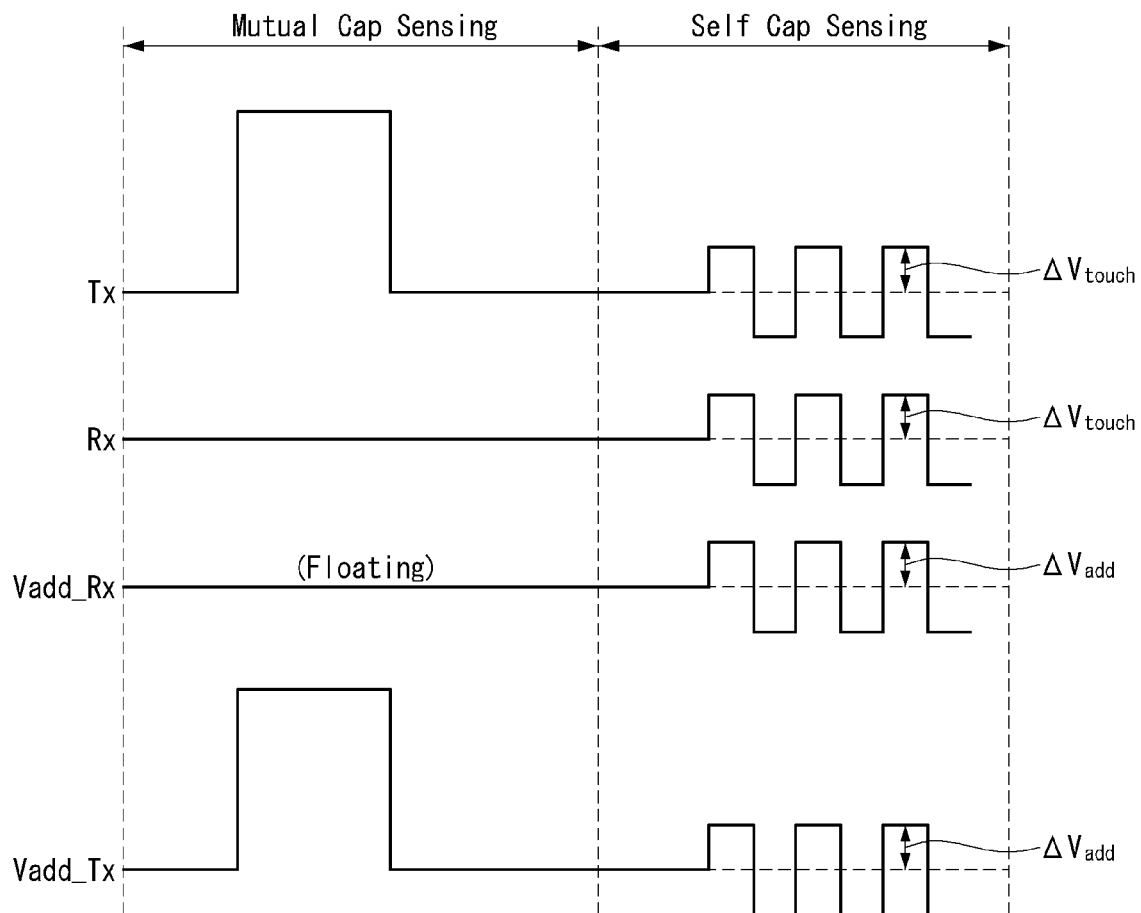
FIG. 13 is a waveform diagram schematically illustrating a drive of a touch sensor according to another embodiment of the disclosure.

With reference to FIGS. 11 to 13, a touch sensor 560 of an electroluminescent display according to another embodiment of the disclosure is described below.

FIG. 11 is a plan view schematically illustrating a second mesh electrode layer of a touch sensor in an electroluminescent display according to another embodiment of the disclosure.

Description of structures and components identical or equivalent to those described above may be briefly made or may be entirely omitted for convenience of explanation.

There is a difference between a touch sensor 560 of an electroluminescent display according to another embodiment of the disclosure and the touch sensor 160 of the electroluminescent display 1000 according to the embodiment of the disclosure in a shape of a first mesh electrode layer. The touch sensor 560 further includes a sixth mesh electrode 563-2.

A first mesh electrode 162 of FIG. 11 is substantially the same as the first mesh electrode 162 of FIG. 2, and thus a duplicated description will be omitted for brevity. A fifth mesh electrode 563-1 and the sixth mesh electrode 563-2 shown in FIG. 11 are electrically insulated from each other by a first disconnection portion CUT1.

The fifth mesh electrode 563-1 is configured to overlap a fourth mesh electrode 167 in as large an area as possible compared with other components. In other words, an overlap area between the fifth mesh electrode 563-1 and the fourth mesh electrode 167 is greater than an overlap area between the fifth mesh electrode 563-1 and a third mesh electrode 166. Thus, the fifth mesh electrode 563-1 is configured to shield the fourth mesh electrode 167 from a cathode electrode.

The sixth mesh electrode 563-2 is configured to overlap the third mesh electrode 166 in as large an area as possible compared with other components. In other words, an overlap area between the sixth mesh electrode 563-2 and the third mesh electrode 166 is greater than an overlap area between the sixth mesh electrode 563-2 and the fourth mesh electrode 167. Thus, the sixth mesh electrode 563-2 is configured to shield the third mesh electrode 166 from the cathode electrode.

According to the above-described configuration, the touch sensor 560 can efficiently shield a parasitic capacitance using the fifth mesh electrode 563-1 and the sixth mesh electrode 563-2 configured respectively corresponding to the fourth mesh electrode 167 and the third mesh electrode 166.

A first wire portion 569 connected to the first mesh electrode layer is disposed in a non-display area NA. The first wire portion 569 is connected to a pad portion PAD. The touch sensor 560 may be electrically connected to a circuit unit through the pad portion PAD. The first wire portion 569 is connected to a channel of each of the fifth mesh electrode 563-1 and the sixth mesh electrode 563-2. Thus, the channel of each of the fifth mesh electrode 563-1 and the sixth mesh electrode 563-2 may receive a shielding signal.

FIG. 12 is a conceptual diagram schematically illustrating a drive of a touch sensor according to another embodiment of the disclosure.

Description of structures and components identical or equivalent to those described above may be briefly made or may be entirely omitted for convenience of explanation.

The touch sensor 560 of the electroluminescent display according to another embodiment of the disclosure receives a touch driving signal Tx to be supplied to the third mesh electrode 166 from the circuit unit (for example, a touch driver for sensing a mutual capacitance). The touch driver receives a touch sensing signal Rx from the fourth mesh electrode 167 and determines whether or not a touch operation is performed. The first mesh electrode 162 performs a bridge function of connecting blocks of the fourth mesh electrode 167 through a contact hole CNT.

The fifth mesh electrode 563-1 vertically corresponds to the fourth mesh electrode 167. The fifth mesh electrode 563-1 is configured to overlap the fourth mesh electrode 167 in as large an area as possible. Namely, the fifth mesh electrode 563-1 is configured to shield a parasitic capacitance which may be generated between the fourth mesh electrode 167 and the cathode electrode.

The sixth mesh electrode 563-2 vertically corresponds to the third mesh electrode 166. The sixth mesh electrode 563-2 is configured to overlap the third mesh electrode 166 in as large an area as possible. Namely, the sixth mesh electrode 563-2 is configured to shield a parasitic capacitance which may be generated between the third mesh electrode 166 and the cathode electrode.

The fifth mesh electrode 563-1 is configured to receive a first shielding signal Vadd_Rx. The sixth mesh electrode 563-2 is configured to receive a second shielding signal Vadd_Tx.

FIG. 13 is a waveform diagram schematically illustrating a drive of a touch sensor according to another embodiment of the disclosure.

The touch sensor 560 of the electroluminescent display according to another embodiment of the disclosure is configured to operate in at least one sensing mode.

For example, the touch sensor 560 may operate to sense a mutual capacitance, sense a self-capacitance, or sequentially sense a mutual capacitance and a self-capacitance.

FIG. 13 is merely an example of a waveform diagram. The electroluminescent display according to another embodiment of the disclosure may operate in only a mutual capacitance sensing period and also operate in only a self-capacitance sensing period.

The mutual capacitance sensing period Mutual Cap Sensing is described below.

The fifth mesh electrode 563-1 of the touch sensor 560 of the electroluminescent display according to another embodiment of the disclosure is configured to receive the first shielding signal Vadd_Rx through the first wire portion 569 in the mutual capacitance sensing period. The first shielding signal Vadd_Rx may be set to a floating voltage capable of reducing a difference between a voltage of the touch sensing signal Rx and a voltage of the cathode electrode.

The sixth mesh electrode 563-2 of the touch sensor 560 of the electroluminescent display according to another embodiment of the disclosure is configured to receive the second shielding signal Vadd_Tx through the first wire portion 569 in the mutual capacitance sensing period. The second shielding signal Vadd_Tx may be set to a specific voltage capable of reducing a difference between a voltage of the touch driving signal Tx and a voltage of the cathode electrode. For example, the second shielding signal Vadd_Tx may be synchronized with the touch driving signal Tx.

The touch driver is configured to apply voltages corresponding to the fifth mesh electrode 563-1 and the sixth mesh electrode 563-2.

According to the above-described driving method, because the plurality of shielding signals can be optimized to the touch driving signal Tx and the touch sensing signal Rx and can be provided for the touch sensor 560, a parasitic capacitance resulting from the cathode electrode can be efficiently blocked. Further, a potential difference between the sixth mesh electrode 563-2 and the third mesh electrode 166 and a potential difference between the fifth mesh electrode 563-1 and the fourth mesh electrode 167 can be minimized. Thus, the touch sensitivity of the touch sensor 560 can be improved.

The self-capacitance sensing period Self-Cap Sensing is described below.

The fifth mesh electrode 563-1 of the touch sensor 560 of the electroluminescent display according to another embodiment of the disclosure is configured to receive the first shielding signal Vadd_Rx through the first wire portion 169 in the self-capacitance sensing period Self-Cap Sensing.

Further, the sixth mesh electrode 563-2 is configured to receive the second shielding signal Vadd_Tx through the first wire portion 169 in the self-capacitance sensing period Self-Cap Sensing.

The first shielding signal Vadd_Rx and the second shielding signal Vadd_Tx in the self-capacitance sensing period Self-Cap Sensing are synchronized with a self-capacitance sensing touch driving signal Tx applied to the third mesh electrode 166 and a self-capacitance sensing touch driving signal Rx applied to the fourth mesh electrode 167.

In the self-capacitance sensing period Self-Cap Sensing, pulses, in which a first touch signal Tx, a second touch sensing signal Rx, and the shielding signal Vadd are synchronized, are supplied to the third mesh electrode 166. In other words, in a self-capacitance sensing method, channels of each touch electrode do not dividedly operate as the driving electrode and the sensing electrode. Namely, embodiments are not limited to the names of the touch driving signal Tx and the touch sensing signal Rx. In the self-capacitance sensing period Self-Cap Sensing, the touch driving signal Tx and the touch sensing signal Rx may mean signals configured to sense the self-capacitance of channels of the third mesh electrode 166 and the self-capacitance of channels of the fourth mesh electrode 167 in the touch sensor 560.

According to the driving method described above, because the first shielding signal Vadd_Rx and the second shielding signal Vadd_Tx operate synchronously with the first touch signal Tx and the second touch signal Rx, a potential difference between the first mesh electrode layer 161 and the second mesh electrode layer 165 may be substantially uniform in the self-capacitance sensing period Self-Cap Sensing. Thus, most of the parasitic capacitance resulting from the cathode electrode is formed in the second mesh electrode 163. Because the second mesh electrode 163 is synchronized with the signals applied to the third mesh electrode 166 and the fourth mesh electrode 167 while shielding the parasitic capacitance, the third mesh electrode 166 and the fourth mesh electrode 167 are not substantially affected by the fifth mesh electrode 563-1 and the sixth mesh electrode 563-2. Thus, the touch sensitivity of the touch sensor 560 can be improved.

Figure 14:
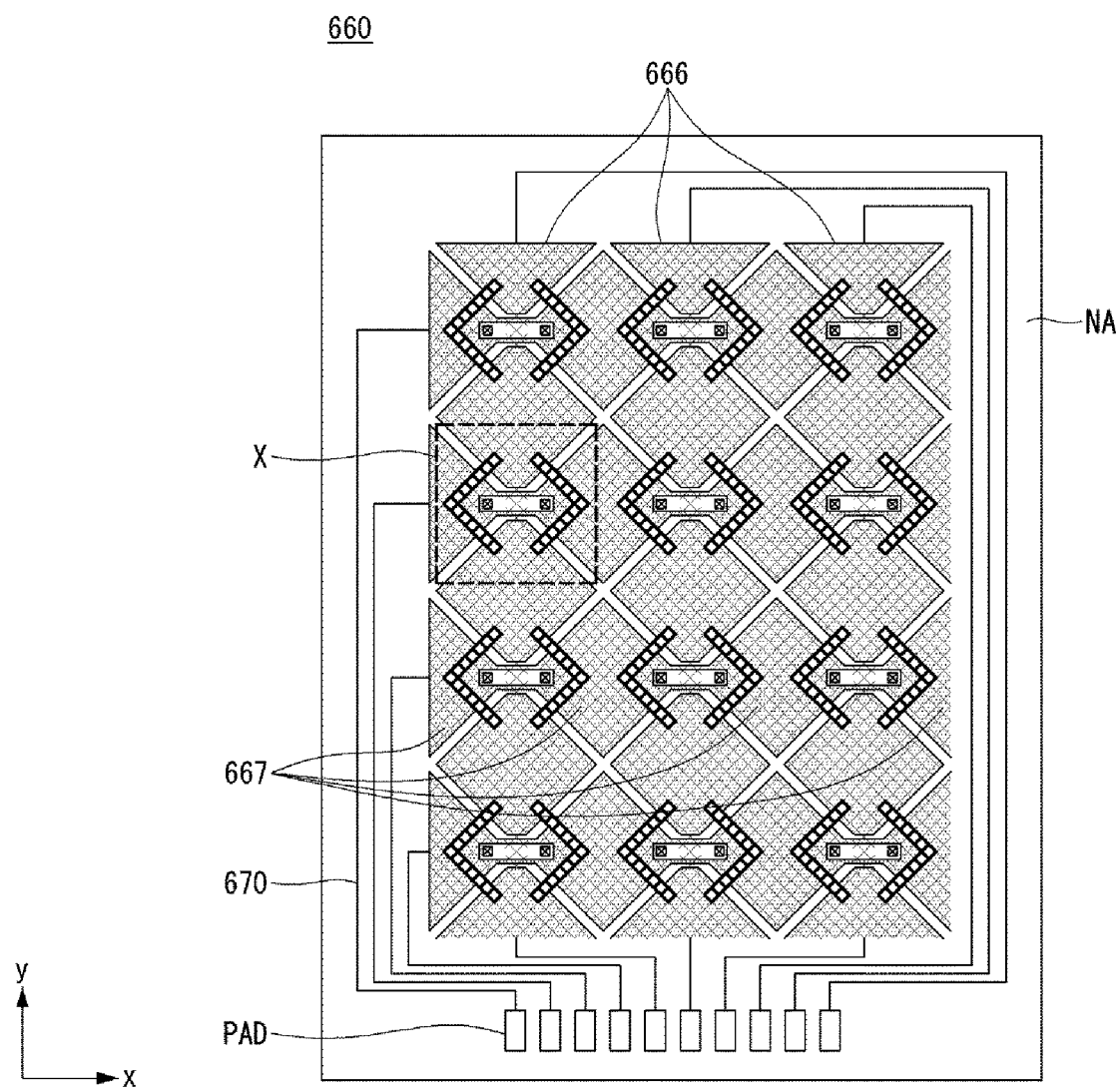
FIG. 14 is a plan view schematically illustrating a bridge mesh electrode, a transparent shielding electrode, and a mesh electrode of a touch sensor in an electroluminescent display according to another embodiment of the disclosure.

FIG. 14 is a plan view schematically illustrating a bridge mesh electrode, a transparent shielding electrode, and a mesh electrode of a touch sensor in an electroluminescent display according to another embodiment of the disclosure.

Description of structures and components identical or equivalent to those described above with reference to FIGS. 1 to 13 may be briefly made or may be entirely omitted for convenience of explanation.

A touch sensor 660 according to another embodiment of the disclosure may be formed on a display panel. Since the display panel may be substantially the same as the display panel 102 described above, a detailed description is omitted.

The touch sensor 660 according to another embodiment of the disclosure may be configured such that a transparent shielding electrode is formed between mesh electrodes 666 and 667 and a cathode electrode 133, in order to shield a parasitic capacitance that may be generated between the mesh electrodes 666 and 667 and the cathode electrode 133.

Since the third mesh electrode 666 of the touch sensor 660 according to another embodiment of the disclosure is substantially the same as the third mesh electrode 166 of the touch sensor 160 described above, a further description is omitted.

Since the fourth mesh electrode 667 of the touch sensor 660 according to another embodiment of the disclosure is substantially the same as the third mesh electrode 167 of the touch sensor 160 described above, a further description is omitted.

The mesh electrodes 666 and 667 of the touch sensor 660 according to another embodiment of the disclosure were merely referred to as the third mesh electrode 666 and the fourth mesh electrode 667 for convenience of comparison with other embodiments. For example, the third mesh electrode 666 may be referred to as a first mesh electrode, and the fourth mesh electrode 667 may be referred to as a second mesh electrode.

Since a second wire portion 670 of the touch sensor 660 according to another embodiment of the disclosure is substantially the same as the second wire portion 170 of the touch sensor 160 described above, a further description is omitted.

FIGS. 15A to 15D are plan views schematically illustrating a stack order of components of a touch sensor in an electroluminescent display according to another embodiment of the disclosure.

Figure 15A:
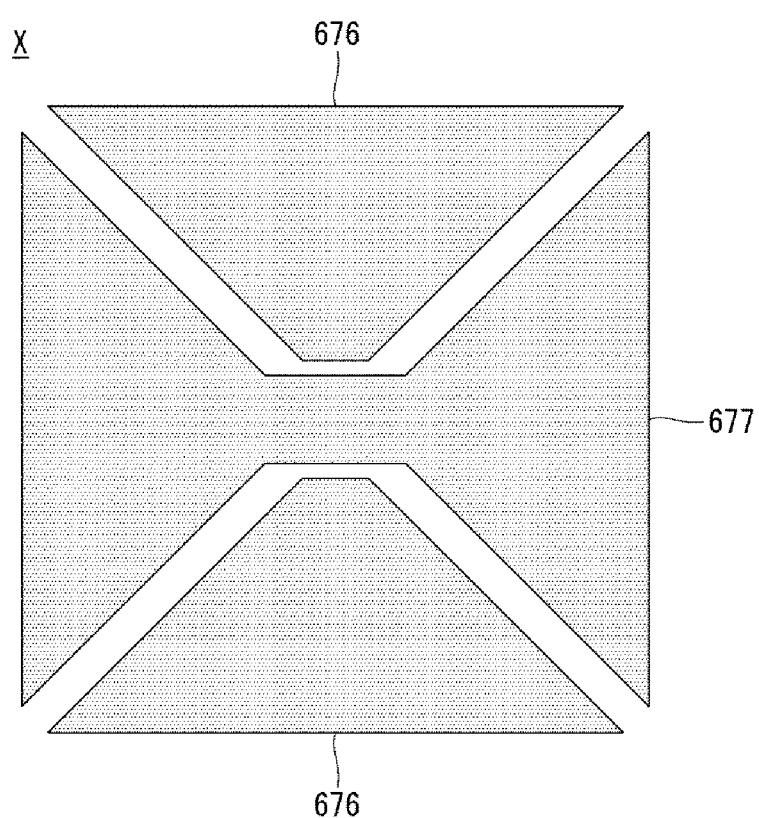
FIGS. 15A to 15D are plan views schematically illustrating a stack order of components of a touch sensor in an electroluminescent display according to another embodiment of the disclosure.

More specifically, FIG. 15A is an enlarged plan view of an area X shown in FIG. 14. In FIG. 15A, only transparent shielding electrodes 676 and 677 formed on the display panel are shown for convenience of explanation.

The first transparent shielding electrode 676 is configured to shield a parasitic capacitance which may be generated between the third mesh electrode 666 and the cathode electrode 133.

The first transparent shielding electrode 676 may be divided into a plurality of blocks. The plurality of blocks of the first transparent shielding electrode 676 may be arranged in a second direction (Y-axis). A shape of each block may correspond to the shape of the third mesh electrode 666. In other words, the first transparent shielding electrode 676 may be formed in a shape capable of overlapping the third mesh electrode 666 in as large an area as possible. Thus, the first transparent shielding electrode 676 can reduce the parasitic capacitance which may be generated between the cathode electrode 133 and the third mesh electrode 666.

The second transparent shielding electrode 677 is configured to shield a parasitic capacitance which may be generated between the fourth mesh electrode 667 and the cathode electrode 133. The second transparent shielding electrode 677 may be extended in a first direction (X-axis). A shape of the second transparent shielding electrode 677 may correspond to the shape of the fourth mesh electrode 667. In other words, the second transparent shielding electrode 677 may be formed in the shape capable of overlapping the fourth mesh electrode 667 in as large an area as possible. Thus, the second transparent shielding electrode 677 can reduce the parasitic capacitance which may be generated between the fourth mesh electrode 667 and the cathode electrode 133.

Figure 15B:
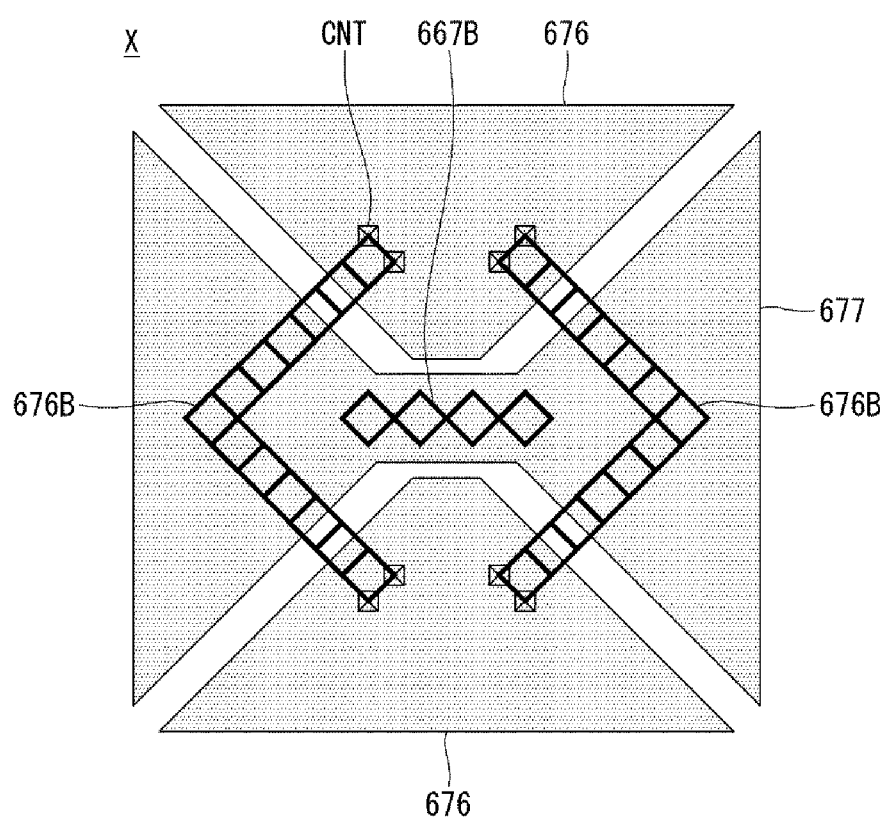

FIG. 15B illustrates bridge mesh electrodes 667B and 676B formed on the transparent shielding electrodes 676 and 677 on the display panel for convenience of explanation.

The bridge mesh electrodes 667B and 676B each include a plurality of openings surrounding the pixel.

The first bridge mesh electrode 667B and the second bridge mesh electrode 676B may be formed using substantially the same electrode layer as the first mesh electrode layer 161 described in the embodiments of the disclosure. In the following description of the first bridge mesh electrode 667B and the second bridge mesh electrode 676B, a description overlapping with the first mesh electrode layer 161 is omitted for convenience of explanation.

An insulating layer is formed on the transparent shielding electrodes 676 and 677. Hence, the transparent shielding electrodes 676 and 677 are electrically insulated from the first bridge mesh electrode 667B and the second bridge mesh electrode 676B.

The second bridge mesh electrode 676B is configured to electrically connect the separated first transparent shielding electrodes 676 to each other. At least one contact hole CNT may be formed in an overlap area between the first transparent shielding electrodes 676, which are separated from each other on the upper side and the lower side, and the second bridge mesh electrode 676B, so that the second bridge mesh electrode 676B is electrically connected to the first transparent shielding electrodes 676. Thus, the second bridge mesh electrode 676B can electrically connect the separated first transparent shielding electrodes 676. The second bridge mesh electrode 676B is electrically insulated from the second transparent shielding electrodes 677. The first bridge mesh electrode 667B is electrically insulated from the transparent shielding electrodes 676 and 677.

Figure 15C:
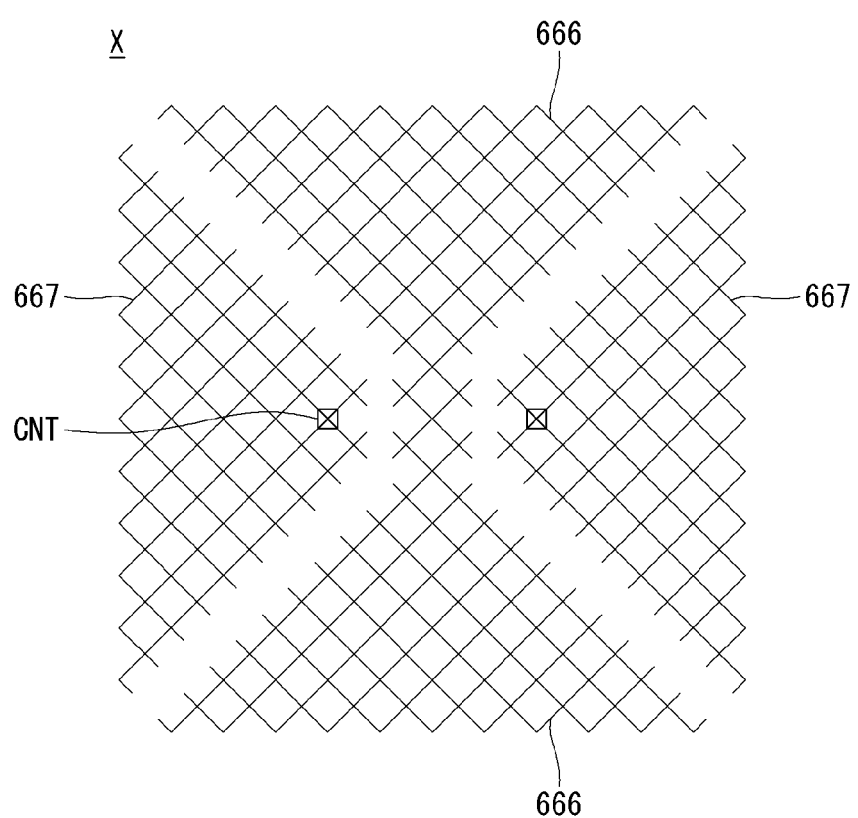

FIG. 15C illustrates the transparent shielding electrodes 676 and 677 on the display panel, the first mesh electrode 666 and the second mesh electrode 667 on the bridge mesh electrodes 667B and 676B for convenience of explanation. Since the first mesh electrode 666 of the touch sensor 660 is substantially the same as the third mesh electrode 166 of the touch sensor 160 described above, a further description is omitted. Further, since the second mesh electrode 667 of the touch sensor 660 is substantially the same as the fourth mesh electrode 167 of the touch sensor 160 described above, a further description is omitted.

The first bridge mesh electrode 667B electrically connects the separated second mesh electrodes 667 to each other through contact holes CNT.

According to the above-described configuration, even if the thickness of the encapsulation unit of the display panel decreases, the first mesh electrode 666 and the second mesh electrode 667 can reduce the parasitic capacitance resulting from the cathode electrode 133 using the first transparent shielding electrodes 676 and the second transparent shielding electrodes 677.

Figure 15D:
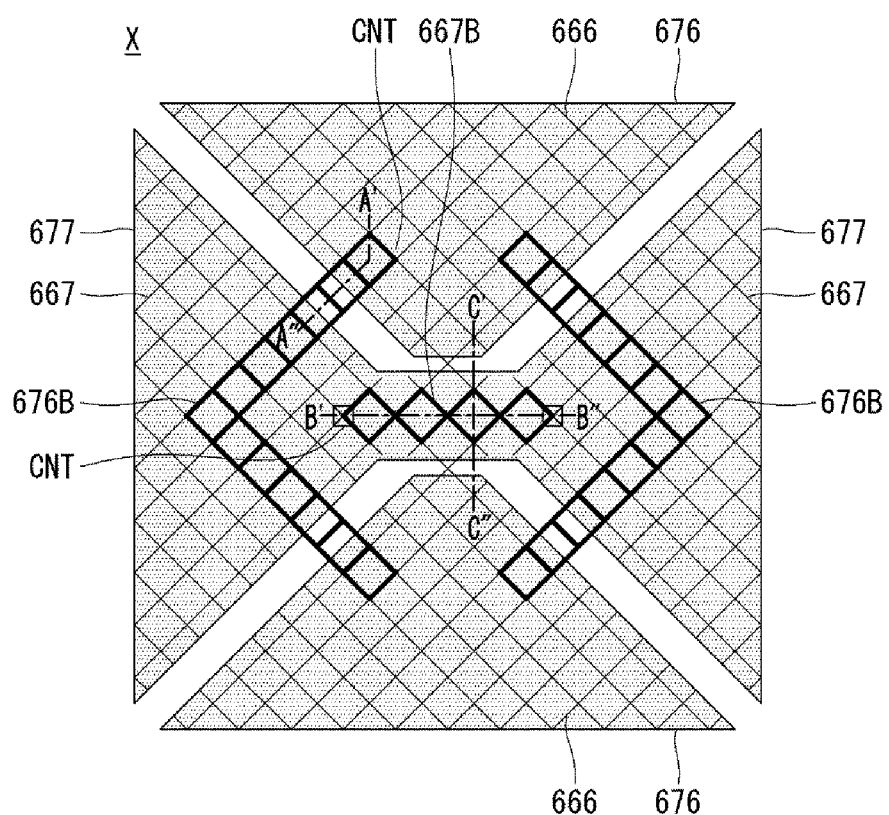
Figure 16A:
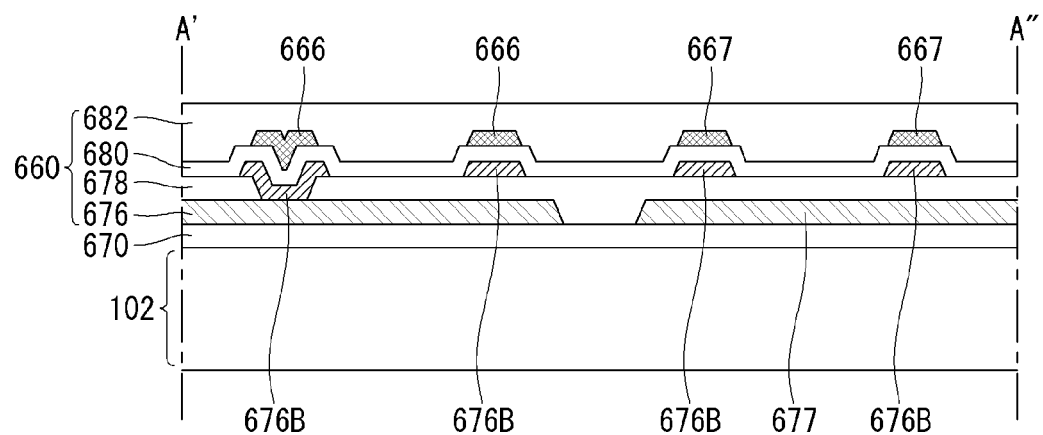
FIG. 16A is a cross-sectional view schematically illustrating a cutting surface A'-A" of a touch sensor according to another embodiment of the disclosure.
Figure 16B:
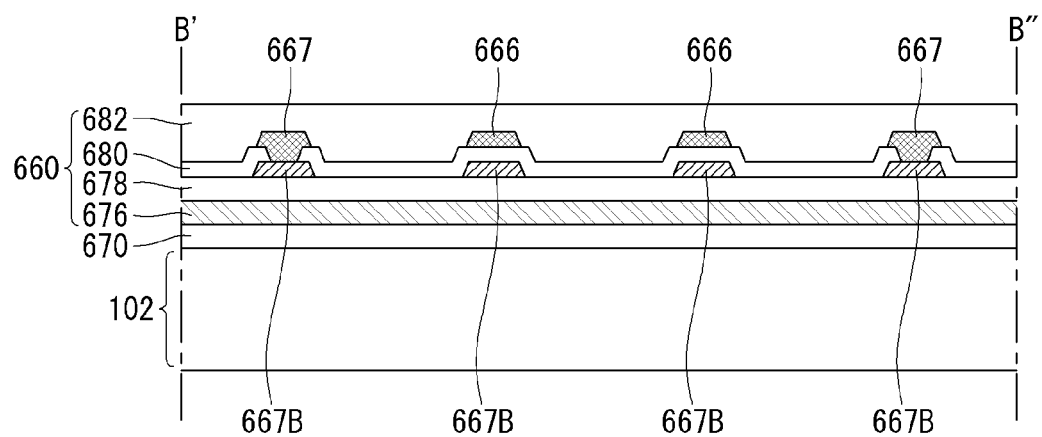
FIG. 16B is a cross-sectional view schematically illustrating a cutting surface B'-B" of a touch sensor according to another embodiment of the disclosure.
Figure 16C:
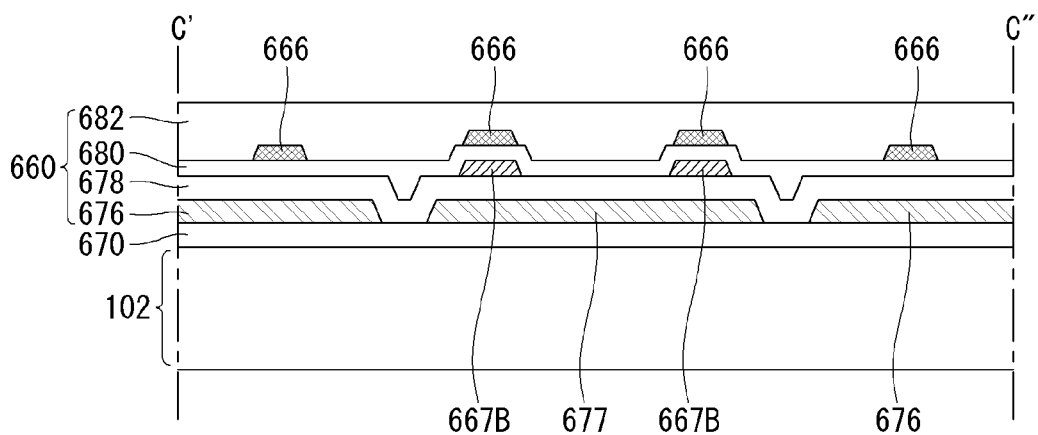
FIG. 16C is a cross-sectional view schematically illustrating a cutting surface C'-C" of a touch sensor according to another embodiment of the disclosure.

FIG. 16A is a cross-sectional view schematically illustrating a cutting surface A'-A" of a touch sensor according to another embodiment of the disclosure as shown in FIG. 15D. FIG. 16B is a cross-sectional view schematically illustrating a cutting surface B'-B" of a touch sensor according to another embodiment of the disclosure as shown in FIG. 15D. FIG. 16C is a cross-sectional view schematically illustrating a cutting surface C'-C" of a touch sensor according to another embodiment of the disclosure as shown in FIG. 15D.

Referring to FIG. 16A, a touch buffer layer 670 may be further disposed on the display panel 102. The touch buffer layer 670 may be disposed between the display panel 102 and the touch sensor 660. The touch buffer layer 670 can prevent pads of the display panel 102 formed in the non-display area NA of the display panel 102 from being corroded in an etching process for forming the touch sensor 660 on an encapsulation unit 140. A thickness of the touch buffer layer 670 may be less than a thickness of a second inorganic encapsulation layer 143. The touch buffer layer 670 may be formed of an inorganic material such as silicon nitride (SiNx), silicon oxide (SiOx), or silicon oxynitride (SiON). A thickness of the touch buffer layer 670 may be 0.1 m to 0.4 m. However, embodiments are not limited thereto. The touch buffer layer 670 may be removed, if necessary or desired.

Referring to the cutting surfaces A'-A", B'-B" and C'-C", a transparent conductive layer, for example, indium-tin-oxide (ITO) is patterned on the display panel 102 or the touch buffer layer 670 to form the first transparent shielding electrode 676 and the second transparent shielding electrode 677. However, embodiments are not limited to ITO. The first transparent shielding electrode 676 and the second transparent shielding electrode 677 are electrically insulated from each other. A shielding electrode insulating layer 678 may be disposed on the first transparent shielding electrode 676 and the second transparent shielding electrode 677. The shielding electrode insulating layer 678 may have a thickness range corresponding to materials usable in the first touch insulating layer 164 of the touch sensor 160. Therefore, a description overlapping with that described above is omitted. A contact hole may be formed in a portion of the shielding electrode insulating layer 678, and thus the first transparent shielding electrode 676 and the second bridge mesh electrode 676B may be electrically connected to each other.

A first touch insulating layer 680 may be disposed on the second bridge mesh electrode 676B. Since the first touch insulating layer 680 of the touch sensor 660 may be configured substantially the same as the first touch insulating layer 164 of the touch sensor 160, a duplicated description is omitted.

The first and second mesh electrodes 666 and 667 may be disposed on the first touch insulating layer 680. Since the first mesh electrode 666 and the second mesh electrode 667 of the touch sensor 660 may be configured substantially the same as the third mesh electrode 166 and the fourth mesh electrode 167 of the touch sensor 160, a duplicated description is omitted.

A second touch insulating layer 682 may be disposed on the first mesh electrode 666 and the second mesh electrode 667. Since the second touch insulating layer 682 of the touch sensor 660 may be configured substantially the same as the second touch insulating layer 168 of the touch sensor 160, a duplicated description is omitted.

Embodiments of the disclosure may be described as follows.

Embodiments of the disclosure may provide an electroluminescent display including an electroluminescent element disposed in a display area of a substrate, an encapsulation unit disposed on the electroluminescent element, a plurality of transparent shielding electrodes disposed on the encapsulation unit, a shielding electrode insulating layer covering the plurality of transparent shielding electrodes, a plurality of bridge mesh electrodes positioned on the shielding electrode insulating layer, a first touch insulating layer covering the plurality of bridge mesh electrodes, and a plurality of mesh electrodes positioned on the first touch insulating layer, wherein some of the plurality of bridge mesh electrodes are configured to connect some of the plurality of transparent shielding electrodes through a contact hole of the shielding electrode insulating layer, wherein other some of the plurality of bridge mesh electrodes are configured to connect some of the plurality of mesh electrodes through a contact hole of the first touch insulating layer.

The plurality of bridge mesh electrodes may have a metal mesh shape including an opening in which a subpixel including the electroluminescent element is disposed. The electroluminescent display may further include a touch buffer layer disposed between the encapsulation unit and the plurality of transparent shielding electrodes. The plurality of transparent shielding electrodes may be configured to reduce a parasitic capacitance formed between a cathode electrode of the electroluminescent element and the plurality of mesh electrodes. A thickness of the encapsulation unit may be equal to or less than at least 5 m. The plurality of mesh electrodes may be configured to operate using at least one of a mutual capacitance sensing method and a self-capacitance sensing method, and some of the plurality of transparent shielding electrodes may be in a floating state. The plurality of mesh electrodes may be configured to operate using at least one of the mutual capacitance sensing method and the self-capacitance sensing method, and other some of the plurality of transparent shielding electrodes may be synchronized with a touch driving signal. Some of the plurality of bridge mesh electrodes may be configured to completely overlap the plurality of transparent shielding electrodes, and other some of the plurality of bridge mesh electrodes may be configured to traverse an area in which the plurality of transparent shielding electrodes is not formed.

According to the above-described configuration, embodiments of the disclosure may be modified using the transparent shielding electrodes. Embodiments of the disclosure can shield a parasitic capacitance resulting from the cathode electrode and reduce a thickness of the encapsulation unit. Further, because a shielding area can further increase, the parasitic capacitance can be shielded more efficiently.

Embodiments of the disclosure may provide an electroluminescent display including an electroluminescent element disposed in a display area of a substrate, an encapsulation unit disposed on the electroluminescent element, a first mesh electrode layer disposed on the encapsulation unit, an insulating layer covering the first mesh electrode layer, and a second mesh electrode layer disposed on the insulating layer, wherein the first mesh electrode layer includes a first mesh electrode and a second mesh electrode separated from the first mesh electrode, wherein the second mesh electrode layer includes a third mesh electrode extended in a first direction and a fourth mesh electrode extended in a second direction intersecting the first direction through the first mesh electrode intersecting the third mesh electrode.

The first mesh electrode layer may include a first opening and a first disconnection portion, and the second mesh electrode layer may include a second opening and a second disconnection portion. The electroluminescent element may be disposed in the first opening and the second opening, or disposed in the first disconnection portion and the second disconnection portion.

The electroluminescent element may include a common electrode. The first mesh electrode and the common electrode may be configured to generate a capacitance. The second mesh electrode layer may be configured to generate a capacitance and sense a touch input. A parasitic capacitance between the common electrode and the third and fourth mesh electrodes may be minimized by the second mesh electrode. The third mesh electrode and the fourth mesh electrode may be configured to operate using at least one of a mutual capacitance sensing method and a self-capacitance sensing method. The second mesh electrode may be configured to operate corresponding to the at least one sensing method. The electroluminescent element may include a common electrode. A distance between the common electrode and the first mesh electrode layer may be 3 m to 30 m, and a distance between the first mesh electrode layer and the second mesh electrode layer may be 0.01 m to 3 m. In the display area, 80% or more of an area of the second mesh electrode layer may overlap the first mesh electrode layer.

Embodiments of the disclosure may provide a flexible electroluminescent display including a flexible substrate, a transistor positioned on the flexible substrate, an anode electrode positioned on the transistor, a bank surrounding the anode electrode, an electroluminescent layer positioned on the anode electrode, a cathode electrode positioned on the electroluminescent layer, a flexible encapsulation unit positioned on the cathode electrode, a first mesh electrode layer positioned on the flexible encapsulation unit and configured to overlap the bank and generate a first capacitance together with the cathode electrode, an insulating layer covering the first mesh electrode layer, and a second mesh electrode layer positioned on the insulating layer and configured to overlap the first mesh electrode layer and generate a second capacitance together with the first mesh electrode layer.

A magnitude of the first capacitance may be greater than a magnitude of the second capacitance. The flexible electroluminescent display may further include a touch driver electrically connected to the first mesh electrode layer and the second mesh electrode layer. The touch driver may be configured to apply a predetermined voltage to each of the first mesh electrode layer and the second mesh electrode layer. When the first capacitance increases due to the predetermined voltage, the second capacitance may be reduced. The second mesh electrode layer may be divided into a plurality of blocks and configured to sense a touch input. The first mesh electrode layer may be divided into a plurality of blocks and configured to perform a bridge function of connecting some of the plurality of blocks of the second mesh electrode layer while reducing a parasitic capacitance between the cathode electrode and the second mesh electrode layer. The touch driver may be configured to sequentially perform a mutual capacitance sensing drive and a self-capacitance sensing drive. The flexible encapsulation unit may include a first inorganic encapsulation layer configured to seal the cathode electrode, an organic layer configured to planarize the first inorganic encapsulation layer, and a second inorganic encapsulation layer configured to seal the organic layer. A thickness of the flexible encapsulation unit may be less than 10 μm.

Embodiments of the disclosure may provide a touch sensor integrated display including a substrate, a plurality of subpixels disposed on the substrate, the plurality of subpixels including a plurality of circuit units configured to supply an image signal and an electroluminescent diode electrically connected to the plurality of circuit units, an encapsulation unit configured to cover the plurality of subpixels, a first mesh electrode layer that is disposed on the encapsulation unit and is divided into a plurality of areas by a predetermined disconnection pattern, an insulating layer covering the first mesh electrode layer, and a second mesh electrode layer that is disposed on the insulating layer and is divided into a plurality of areas by a predetermined disconnection pattern, wherein a shape of the predetermined disconnection pattern of the first mesh electrode layer is different from a shape of the predetermined disconnection pattern of the second mesh electrode layer, wherein at least a portion of the first mesh electrode layer and at least a portion of the second mesh electrode layer are configured to receive the same signal.

A parasitic capacitance between the plurality of subpixels and the second mesh electrode layer may be reduced by the same signal. The plurality of subpixels may include red subpixels, green subpixels, and blue subpixels. The subpixels may be separated from one another by the bank. The first mesh electrode layer and the second mesh electrode layer may be vertically aligned on the bank.

The second mesh electrode layer may include a plurality of touch electrodes disposed along a first direction and a second direction intersecting the first direction. The first mesh electrode layer may include active shielding electrodes. The active shielding electrodes may be disposed along the first direction.

As described above, the embodiments of the disclosure can solve various problems resulting from the parasitic capacitance generated between the cathode electrode and the touch electrode by providing the shielding electrode between the cathode electrode and the touch electrode.

The embodiments of the disclosure can reduce the parasitic capacitance generated between the cathode electrode and the touch electrode by actively driving the shielding electrode between the cathode electrode and the touch electrode.

The embodiments of the disclosure can improve the flexibility characteristics of the electroluminescent display by minimizing the thickness of the encapsulation unit.

The embodiments of the disclosure can simultaneously form the bridge and the shielding electrode without adding a separate process.

The effects and the advantages according to the embodiments of the disclosure are limited to the above description, and additional features and advantages are included in the embodiments of the disclosure.

Although the embodiments have been described with reference to a number of illustrative embodiments thereof, numerous other modifications and embodiments may be devised by those skilled in the art that will fall within the scope of the principles of this disclosure. In particular, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A foldable display comprising:
a substrate including a display region and a non-display region;
a pad area on the non-display region;
a transistor on the display region of the substrate, the transistor having an active layer, a source electrode, a drain electrode, and a gate electrode;
a planarization layer on the transistor;
an anode electrode on the planarization layer;
a bank surrounding the anode electrode;
a spacer on the bank;
an electroluminescent layer on the anode electrode;
a cathode electrode on the electroluminescent layer and the bank;
an encapsulation unit on the cathode electrode;
a touch buffer layer on the encapsulation unit; and
a touch sensor on the touch buffer layer, wherein the touch sensor includes a first touch electrode and a second touch electrode, wherein the first touch electrode and the second touch electrode comprise a multi-layer structure including a first titanium layer, an aluminum layer, and a second titanium layer, and wherein a layer of the multi-layer structure has a different width at a portion crossing with the first touch electrode and the second touch electrode.

2. The foldable display of claim 1, wherein the spacer is higher than a height of a portion of the bank.

3. The foldable display of claim 1, wherein the electroluminescent layer has a single-layer structure or a multi-layer structure.

4. The foldable display of claim 1, wherein the encapsulation unit has a thickness of less than 10 μm.

5. The foldable display of claim 1, wherein the encapsulation unit includes at least a first inorganic encapsulation layer and a second inorganic encapsulation layer.

6. The foldable display of claim 5, wherein the first inorganic encapsulation layer has a thickness of 0.1 μm to 1.5 μm.

7. The foldable display of claim 5, wherein the second inorganic encapsulation layer has a thickness of 0.1 μm to 1.5 μm.

8. The foldable display of claim 5, wherein a thickness of the touch buffer layer is thinner than a thickness of the second inorganic encapsulation layer.

9. The foldable display of claim 1, further comprising:
a first touch insulating layer between the first touch electrode and the second touch electrode at the portion crossing with the first touch electrode and the second touch electrode.

10. The foldable display of claim 9, wherein the first touch insulating layer has a thickness of 0.01 μm to 3 μm.

11. The foldable display of claim 1, wherein the first touch electrode and the second touch electrode have a mesh structure.

12. The foldable display of claim 1, wherein the first touch electrode generates a first capacitance with the cathode electrode, and the second touch electrode generates a second capacitance with the first touch electrode.

13. The foldable display of claim 1, wherein at least one of the first touch electrode and the second touch electrode comprises a three-layer structure including a first titanium layer, an aluminum layer, and a second titanium layer.

14. The foldable display of claim 1, wherein the cathode electrode is on the spacer.

15. The foldable display of claim 1, wherein the cathode electrode is in contact with the spacer or the bank.

16. The foldable display of claim 1, wherein at least one of the first touch electrode and the second touch electrode overlaps the spacer or the bank.

17. The foldable display of claim 1, further comprising:
a shielding electrode on the substrate, the shielding electrode overlapping the bank or the transistor.

18. The foldable display of claim 1, wherein a distance between the first touch electrode and the cathode electrode in a central area of the bank is less than a distance between the first touch electrode and the cathode electrode in an emission region.

* * * * *